United States Patent
Furukawa

(10) Patent No.: US 8,024,681 B2
(45) Date of Patent: Sep. 20, 2011

(54) HIERARCHICAL HDL PROCESSING METHOD AND NON-TRANSITORY COMPUTER-READABLE STORAGE MEDIUM

(75) Inventor: Eiji Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 342 days.

(21) Appl. No.: 12/314,615

(22) Filed: Dec. 12, 2008

(65) Prior Publication Data

US 2009/0100387 A1 Apr. 16, 2009

Related U.S. Application Data

(63) Continuation of application No. PCT/JP2006/311828, filed on Jun. 13, 2006.

(51) Int. Cl.
 *G06F 17/50* (2006.01)
(52) U.S. Cl. ........ 716/103; 716/100; 716/101; 716/102; 716/104; 716/105; 716/110; 716/111; 716/116; 716/117; 716/139; 703/13; 703/14
(58) Field of Classification Search .......... 716/100–107, 716/110–111, 116–117, 139; 703/13–14
See application file for complete search history.

(56) References Cited

U.S. PATENT DOCUMENTS

| | | | | |
|---|---|---|---|---|
| 5,504,690 A | * | 4/1996 | Kageyama et al. | 716/102 |
| 6,009,251 A | * | 12/1999 | Ho et al. | 716/102 |
| 6,080,204 A | * | 6/2000 | Mendel | 716/103 |
| 6,651,235 B2 | * | 11/2003 | Dai et al. | 716/55 |
| 7,475,000 B2 | * | 1/2009 | Cook et al. | 703/14 |
| 7,617,469 B2 | * | 11/2009 | Takei et al. | 716/106 |
| 2001/0056568 A1 | | 12/2001 | Hirotsu et al. | |

FOREIGN PATENT DOCUMENTS

| | | |
|---|---|---|
| JP | 01-304541 | 12/1989 |
| JP | 02-087279 | 3/1990 |
| JP | 04-177470 | 6/1992 |
| JP | 07-078189 | 3/1995 |
| JP | 07-334548 | 12/1995 |
| JP | 09-251480 | 9/1997 |
| JP | 09-330339 | 12/1997 |
| JP | 2000-148805 | 5/2000 |
| JP | 2000-259684 | 9/2000 |
| JP | 2001-357090 | 12/2001 |

OTHER PUBLICATIONS

International Search Report of International Application No. PCT/JP2006/311828 mailed on Jul. 11, 2006.

* cited by examiner

*Primary Examiner* — Nghia Doan

(57) ABSTRACT

A Hardware Description Language (HDL) processing method is implemented in a computer and processes a HDL file which is written in HDL having a hierarchical structure including three or more hierarchical levels in a Computer-Aided Design (CAD) which supports hardware design. The HDL processing method analyzes the hierarchical structure of the HDL and obtaining an analysis result, and processes the HDL one at a time for each hierarchical level based on the analysis result or, process the HDL one at a time by a parallel distributed processing for each hierarchical level based on the analysis result.

14 Claims, 37 Drawing Sheets

FIG.2

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | FILE NAME OF ENTITY STATEMENT | FILE NAME OF ARCHITECTURE STATEMENT |
|---|---|---|---|---|---|---|---|
|  |  |  |  |  |  |  |  |

FIG.6

FILE NAME : E1. vhdl

```
 1:  entity E1 is
 2:     ~
 3:  end;
 4:  architecture A1 of E1 is
 5:     ~
 6:     I2 : E2 port map ~
 7:     I3 : E3 port map ~
 8:     I4 : E4 port map ~
 9:  end;
10:
11:  entity E2 is
12:     ~
13:  end;
14:  architecture A2 of E2 is
15:     ~
16:     I5 : E5 port map ~
17:  end;
18:
19:  entity E3 is
20:     ~
21:  end;
22:  architecture A3 of E3 is
23:     ~
24:     I6 : E6 port map ~
25:  end;
26:
27:  entity E4 is
28:     ~
29:  end;
30:  architecture A4 of E4 is
31:     ~
32:  end;
33:
34:  entity E5 is
35:     ~
36:  end;
37:  architecture A5 of E5 is
38:     ~
39:  end;
40:
41:  entity E6 is
42:     ~
43:  end;
44:  architecture A6 of E6 is
45:     ~
46:  end;.
```

FIG.7

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | FILE NAME OF ENTITY STATEMENT | FILE NAME OF ARCHITECTURE STATEMENT |
|---|---|---|---|---|---|---|---|
| 1 | E1 | 1 | 3 | 4 | 9 | E1.vhdl | E1.vhdl |
| 2 | E2 | 11 | 13 | 14 | 17 | E1.vhdl | E1.vhdl |
| 3 | E3 | 19 | 21 | 22 | 25 | E1.vhdl | E1.vhdl |
| 4 | E4 | 27 | 29 | 30 | 32 | E1.vhdl | E1.vhdl |
| 5 | E5 | 34 | 36 | 37 | 39 | E1.vhdl | E1.vhdl |
| 6 | E6 | 41 | 43 | 44 | 46 | E1.vhdl | E1.vhdl |

FIG.13

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | LINK TO HIGH-LEVEL ENTITY LIST | NUMBER OF LOW-LEVEL ENTITIES | FILE NAME OF ENTITY STATEMENT | FILE NAME OF ARCHITECTURE STATEMENT |
|---|---|---|---|---|---|---|---|---|---|
|  |  |  |  |  |  |  |  |  |  |

FIG.14

| NUMBER | LIST OF LINKS TO ENTITY TABLE |
|---|---|
|  |  |

FIG.15

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | LINK TO HIGH-LEVEL ENTITY LIST | NUMBER OF LOW-LEVEL ENTITIES | FILE NAME OF ENTITY STATEMENT | FILE NAME OF ARCHITECTURE STATEMENT |
|---|---|---|---|---|---|---|---|---|---|
| 1 | E1 | 1 | 3 | 4 | 9 | — | | E1.vhdl | E1.vhdl |
| 2 | E2 | 11 | 13 | 14 | 17 | 1 | | E1.vhdl | E1.vhdl |
| 3 | E3 | 19 | 21 | 22 | 25 | 2 | | E1.vhdl | E1.vhdl |
| 4 | E4 | 27 | 29 | 30 | 32 | 3 | | E1.vhdl | E1.vhdl |
| 5 | E5 | 34 | 36 | 37 | 39 | 4 | | E1.vhdl | E1.vhdl |
| 6 | E6 | 41 | 43 | 44 | 46 | 5 | | E1.vhdl | E1.vhdl |

| NUMBER | LIST OF LINKS TO ENTITY TABLE |
|--------|-------------------------------|
| 1 | 1 |
| 2 | 1 |
| 3 | 1 |
| 4 | 2 |
| 5 | 3 |

FIG.18

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | LINK TO HIGH-LEVEL ENTITY LIST | NUMBER OF LOW-LEVEL ENTITIES | FILE NAME OF ENTITY STATEMENT | FILE NAME OF ARCHITECTURE STATEMENT |
|---|---|---|---|---|---|---|---|---|---|
| 1 | E1 | 1 | 3 | 4 | 9 | – | 3 | E1.vhdl | E1.vhdl |
| 2 | E2 | 11 | 13 | 14 | 17 | 1 | 1 | E1.vhdl | E1.vhdl |
| 3 | E3 | 19 | 21 | 22 | 25 | 2 | 1 | E1.vhdl | E1.vhdl |
| 4 | E4 | 27 | 29 | 30 | 32 | 3 | 0 | E1.vhdl | E1.vhdl |
| 5 | E5 | 34 | 36 | 37 | 39 | 4 | 0 | E1.vhdl | E1.vhdl |
| 6 | E6 | 41 | 43 | 44 | 46 | 5 | 0 | E1.vhdl | E1.vhdl |

FIG.24

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | LINK TO HIGH-LEVEL ENTITY LIST | NUMBER OF LOW-LEVEL ENTITIES | FILE NAME OF ENTITY STATEMENT | FILE NAME OF ARCHITECTURE STATEMENT |
|---|---|---|---|---|---|---|---|---|---|
| 1 | E1 | 1 | 3 | 4 | 9 | – | 2 | E1.vhdl | E1.vhdl |
| 2 | E2 | 11 | 13 | 14 | 17 | 1 | 1 | E1.vhdl | E1.vhdl |
| 3 | E3 | 19 | 21 | 22 | 25 | 2 | 1 | E1.vhdl | E1.vhdl |
| 4 | E4 | 27 | 29 | 30 | 32 | 3 | 0 | E1.vhdl | E1.vhdl |
| 5 | E5 | 34 | 36 | 37 | 39 | 4 | 0 | E1.vhdl | E1.vhdl |
| 6 | E6 | 41 | 43 | 44 | 46 | 5 | 0 | E1.vhdl | E1.vhdl |

FIG.25

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | LINK TO HIGH-LEVEL ENTITY LIST | NUMBER OF LOW-LEVEL ENTITIES | FILE NAME OF ENTITY STATEMENT | FILE NAME OF ARCHITECTURE STATEMENT |
|---|---|---|---|---|---|---|---|---|---|
| 1 | E1 | 1 | 3 | 4 | 9 | — | 2 | E1.vhdl | E1.vhdl |
| 2 | E2 | 11 | 13 | 14 | 17 | 1 | 0 | E1.vhdl | E1.vhdl |
| 3 | E3 | 19 | 21 | 22 | 25 | 2 | 1 | E1.vhdl | E1.vhdl |
| 4 | E4 | 27 | 29 | 30 | 32 | 3 | 0 | E1.vhdl | E1.vhdl |
| 5 | E5 | 34 | 36 | 37 | 39 | 4 | 0 | E1.vhdl | E1.vhdl |
| 6 | E6 | 41 | 43 | 44 | 46 | 5 | 0 | E1.vhdl | E1.vhdl |

FIG.27

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | LINK TO HIGH-LEVEL ENTITY LIST | NUMBER OF LOW-LEVEL ENTITIES | FILE NAME OF ENTITY STATEMENT | FILE NAME OF ARCHITECTURE STATEMENT |
|---|---|---|---|---|---|---|---|---|---|
| 1 | E1 | 1 | 3 | 4 | 9 | — | 2 | E1.vhdl | E1.vhdl |
| 2 | E2 | 11 | 13 | 14 | 17 | 1 | 0 | E1.vhdl | E1.vhdl |
| 3 | E3 | 19 | 21 | 22 | 25 | 2 | 0 | E1.vhdl | E1.vhdl |
| 4 | E4 | 27 | 29 | 30 | 32 | 3 | 0 | E1.vhdl | E1.vhdl |
| 5 | E5 | 34 | 36 | 37 | 39 | 4 | 0 | E1.vhdl | E1.vhdl |
| 6 | E6 | 41 | 43 | 44 | 46 | 5 | 0 | E1.vhdl | E1.vhdl |

FIG.29

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | LINK TO HIGH-LEVEL ENTITY LIST | NUMBER OF LOW-LEVEL ENTITIES | FILE NAME OF ENTITY STATEMENT | FILE NAME OF ARCHITECTURE STATEMENT |
|---|---|---|---|---|---|---|---|---|---|
| 1 | E1 | 1 | 3 | 4 | 9 | — | 1 | E1.vhdl | E1.vhdl |
| 2 | E2 | 11 | 13 | 14 | 17 | 1 | 0 | E1.vhdl | E1.vhdl |
| 3 | E3 | 19 | 21 | 22 | 25 | 2 | 0 | E1.vhdl | E1.vhdl |
| 4 | E4 | 27 | 29 | 30 | 32 | 3 | 0 | E1.vhdl | E1.vhdl |
| 5 | E5 | 34 | 36 | 37 | 39 | 4 | 0 | E1.vhdl | E1.vhdl |
| 6 | E6 | 41 | 43 | 44 | 46 | 5 | 0 | E1.vhdl | E1.vhdl |

FIG.30

| NUMBER | ENTITY NAME | START LINE OF ENTITY STATEMENT | END LINE OF ENTITY STATEMENT | START LINE OF ARCHITECTURE STATEMENT | END LINE OF ARCHITECTURE STATEMENT | LINK TO HIGH-LEVEL ENTITY LIST | NUMBER OF LOW-LEVEL ENTITIES | FILE NAME OF ENTITY STATEMENT | FILE NAME OF ARCHITECTURE STATEMENT |
|---|---|---|---|---|---|---|---|---|---|
| 1 | E1 | 1 | 3 | 4 | 9 | — | 0 | E1.vhdl | E1.vhdl |
| 2 | E2 | 11 | 13 | 14 | 17 | 1 | 0 | E1.vhdl | E1.vhdl |
| 3 | E3 | 19 | 21 | 22 | 25 | 2 | 0 | E1.vhdl | E1.vhdl |
| 4 | E4 | 27 | 29 | 30 | 32 | 3 | 0 | E1.vhdl | E1.vhdl |
| 5 | E5 | 34 | 36 | 37 | 39 | 4 | 0 | E1.vhdl | E1.vhdl |
| 6 | E6 | 41 | 43 | 44 | 46 | 5 | 0 | E1.vhdl | E1.vhdl |

EXECUTION SEQUENCE

HIERARCHICAL HDL PROCESSING METHOD AND NON-TRANSITORY COMPUTER-READABLE STORAGE MEDIUM

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP/2006/311828 filed on Jun. 13, 2006, in the Japanese Patent Office, the disclosure of which is hereby incorporated by reference.

BACKGROUND OF THE INVENTION

1. Field of the Invention

The present invention generally relates to Hardware Description Language (HDL) processing methods and computer-readable storage media, and more particularly to a HDL processing method for processing the HDL in Computer Aided Design (CAD) which supports design of hardware, and to a computer-readable storage medium which stores a program for causing a computer to process the HDL.

2. Description of the Related Art

Conventionally, when processing the HDL, the processing, such as logic synthesis of the HDL and compiling of the logic simulation, is carried out in a single path and not in divisions, as proposed in Japanese Laid-Open Patent Applications No. 7-334548 and No. 9-251480, for example. The logic synthesis of the HDL includes inputting a description of the Resistor Transfer Level (RTL) in a high-level programming language such as the HDL, and processing the description into a description of the Net List in a programming language lower in level compared to the high-level programming language such as the HDL. The processing of the HDL in divisions, in units of blocks, is proposed in Japanese Laid-Open Patent Applications No. 9-330339 and No. 7-78189, for example. In addition, a method of successively processing the HDL for each hierarchical level (or hierarchical layer) from the low hierarchical level is proposed in a Japanese Laid-Open Patent Application No. 2000-148805, for example. Moreover, a method of processing the HDL in parallel for each hierarchical level is proposed in a Japanese Laid-Open Patent Application No. 1-304541, for example.

Recently, the logic scale of Large Scale Integrated circuits (LSIs) has increased considerably, and there are demands to develop the LSI in a short period of time. For this reason, there is a need to reduce the time required for the logic design stage of the LSI development. However, in the conventional logic design stage, the time required to execute the CAD tool for the logic synthesis of the HDL or the logic simulation is not short.

According to the conventional method which does not carry out the processing of the HDL in divisions, the process cannot be executed in parallel in a distributed manner by a plurality of Central Processing Units (CPUs) and a long execution time is required, because the processing, such as the logic synthesis of the HDL and the compiling of the logic simulation, is carried out in a single path. In addition, since the processing is carried out in the single path, a large amount of computer resources such as memories is temporarily used.

On the other hand, the conventional method which carries out the processing of the HDL in divisions does not take into consideration the hierarchical design written in HDL or the parallel execution of the process in the distributed manner.

According to the method of successively processing the HDL for each hierarchical level from the low hierarchical level as proposed in the Japanese Laid-Open Patent Application No. 2000-148805, the parallel execution of the process is impossible. Furthermore, because it is a precondition in the Japanese Laid-Open Patent Application No. 2000-148805 that the configuration statement is written in the Very High-Speed IC (VHSIC) HDL (or simply VHDL), the process cannot be carried out in a language, such as the HDL, which is other than the VHDL, since the grammar corresponding to the configuration statement does not exist in the HDL or the like.

The method of processing the HDL in parallel for each hierarchical level as proposed in the Japanese Laid-Open Patent Application No. 1-304541 can only treat two hierarchical levels, namely, the parent and the child levels. In addition, the processing of the general HDL is impossible because this proposed method cannot cope with a situation where a plurality of instances exist in a certain hierarchical level.

SUMMARY OF THE INVENTION

Accordingly, it is a general object of the present invention to provide a novel and useful HDL processing method and computer-readable storage medium, in which the problems described above are suppressed.

Another and more specific object of the present invention is to provide a HDL processing method and a computer-readable storage medium, which can process the general HDL for each hierarchical level.

According to one aspect of the present invention, there is provided a Hardware Description Language (HDL) processing method, to be implemented in a computer, for processing a HDL file which is written in HDL having a hierarchical structure including three or more hierarchical levels in a Computer-Aided Design (CAD) which supports hardware design, comprising analyzing the hierarchical structure of the HDL and obtaining an analysis result; and processing the HDL one at a time for each hierarchical level based on the analysis result.

According to another aspect of the present invention, there is provided a Hardware Description Language (HDL) processing method, to be implemented in a computer, for processing a HDL file which is written in HDL having a hierarchical structure including three or more hierarchical levels in a Computer-Aided Design (CAD) which supports hardware design, comprising analyzing the hierarchical structure of the HDL and obtaining an analysis result; and processing the HDL by a parallel distributed processing for each hierarchical level based on the analysis result.

According to still another aspect of the present invention, there is provided a computer-readable storage medium on which a computer-readable program for causing a computer to process a Hardware Description Language (HDL) file which is written in HDL having a hierarchical structure including three or more hierarchical levels in a Computer-Aided Design (CAD) which supports hardware design, said program comprising an analyzing procedure causing the computer to analyze the hierarchical structure of the HDL and obtaining an analysis result; and a processing procedure causing the computer to process the HDL one at a time for each hierarchical level based on the analysis result.

According to another aspect of the present invention, the processing procedure may cause the computer to process the HDL one at a time by a parallel distributed processing for each hierarchical level based on the analysis result.

Other objects and further features of the present invention will be apparent from the following detailed description when read in conjunction with the accompanying drawings.

BRIEF DESCRIPTION OF THE DRAWINGS

FIG. 2 is a diagram showing a data structure of an entity table;

FIG. 6 is a diagram showing an example of a VHDL which is input;

FIG. 7 is a diagram showing the entity table that is obtained when the VHDL shown in FIG. 6 is input and the process of the step S1 shown in FIG. 1 is carried out;

FIG. 13 is a diagram showing a data structure of the entity table;

FIG. 14 is a diagram showing a data structure of a high-level entity list table;

FIG. 15 is a diagram showing the entity table for a case where the process of a step S1A is carried out;

FIG. 18 is a diagram showing the entity table for a case where the process of the step S3 is carried out;

FIG. 24 is a diagram showing the entity table for a case where the step S66 is carried out;

FIG. 25 is a diagram showing the entity table for the case where the step S66 is carried out;

FIG. 27 is a diagram showing the entity table for the case where the step S66 is carried out;

FIG. 29 is a diagram showing the entity table for the case where the step S66 is carried out;

FIG. 30 is a diagram showing the entity table for the case where the step S66 is carried out;

DESCRIPTION OF THE PREFERRED EMBODIMENTS

Figure 1:
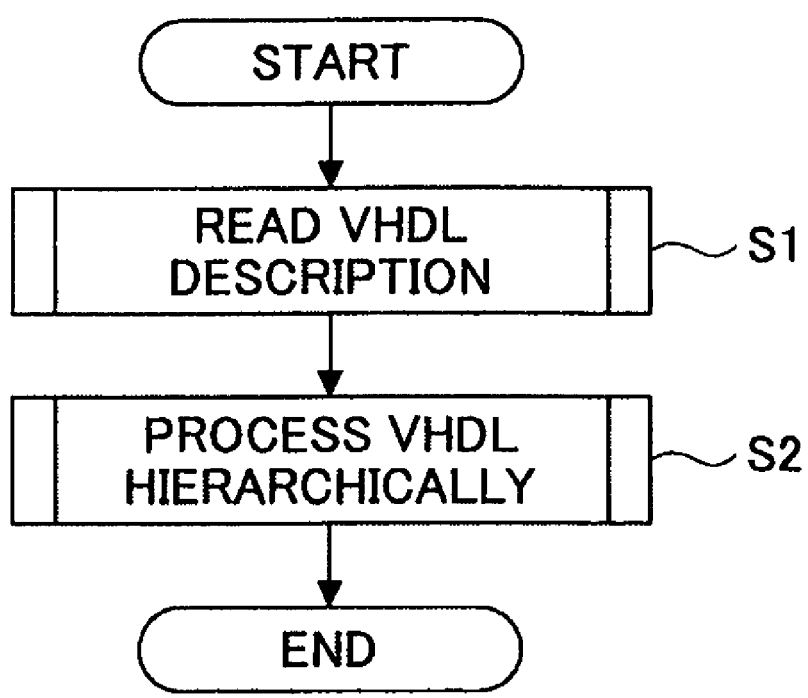
FIG. 1 is a flow chart for explaining a procedure of a first embodiment of the present invention.

According to one aspect of the present invention, the processing of the HDL is executed for each hierarchical level, by taking into account the hierarchical structure of the HDL. The processing of the HDL on a large scale can be executed in a short time, by executing a parallel distributed process for each hierarchical level on a plurality of processors. In addition, by executing the process in divisions for each hierarchical level in a single processor, the processing of the HDL on a large scale can be executed without temporarily using a large amount of computer resources, such as memories.

When executing the processing of the HDL for each hierarchical level, the processing of the HDL may be executed from the low hierarchical level in order to more strictly check the consistency among the hierarchical levels. In this case, the HDL in the low hierarchical level may be checked when executing the processing of the HDL in the high hierarchical level. In addition, when executing the processing of the HDL from the low hierarchical level, the execution sequence may be switched by making it possible to select an option of the execution sequences.

The number of the parallel processes when executing the parallel distributed processing may be limited, so as to prevent a large amount of computer resources, such as memories, from being temporarily used by a plurality of processors.

Next, a description will be given of the embodiments of the HDL processing method and the computer-readable storage medium according to the present invention, by referring to the drawings.

For the sake of convenience, a description will be given of a case where the logic synthesis is carried out in response to an input of the VHDL which is a type of HDL. The VHDL is formed in units called entities for each hierarchical level. In the VHDL, the entity is formed by an entity statement and an architecture statement.

First Embodiment

First, a description will be given of a first embodiment of the present invention. In this embodiment, the parallel distributing processing of the VHDL is executed for each hierarchical level.

FIG. 1 is a flow chart for explaining a procedure of this first embodiment of the present invention. In FIG. 1, a step S1 reads a VHDL file which is written in VHDL from recording medium or a storage unit such as a Hard Disk Drive (HDD), and stores in an entity table a file name, a start line and an end line (position information of the VHDL file) of the entity statement and the architecture statement for each entity.

FIG. 2 is a diagram showing a data structure of the entity table for a case where the parallel distributed processing of the VHDL is executed for each hierarchical level. The entity table shown in FIG. 2 includes the number (or entity number) allocated (or assigned) to the entity, the entity name, the start line of the entity statement, the end line of the entity statement, the start line of the architecture statement, the end line of the architecture statement, the file name of the entity statement, and the file name of the architecture statement. The file names in the entity table may be omitted.

A step S2 processes the VHDL for each hierarchical level by processing each entity, based on the position information of the VHDL file stored in the entity table in the step S1. The process ends after the step S2.

Figure 3:
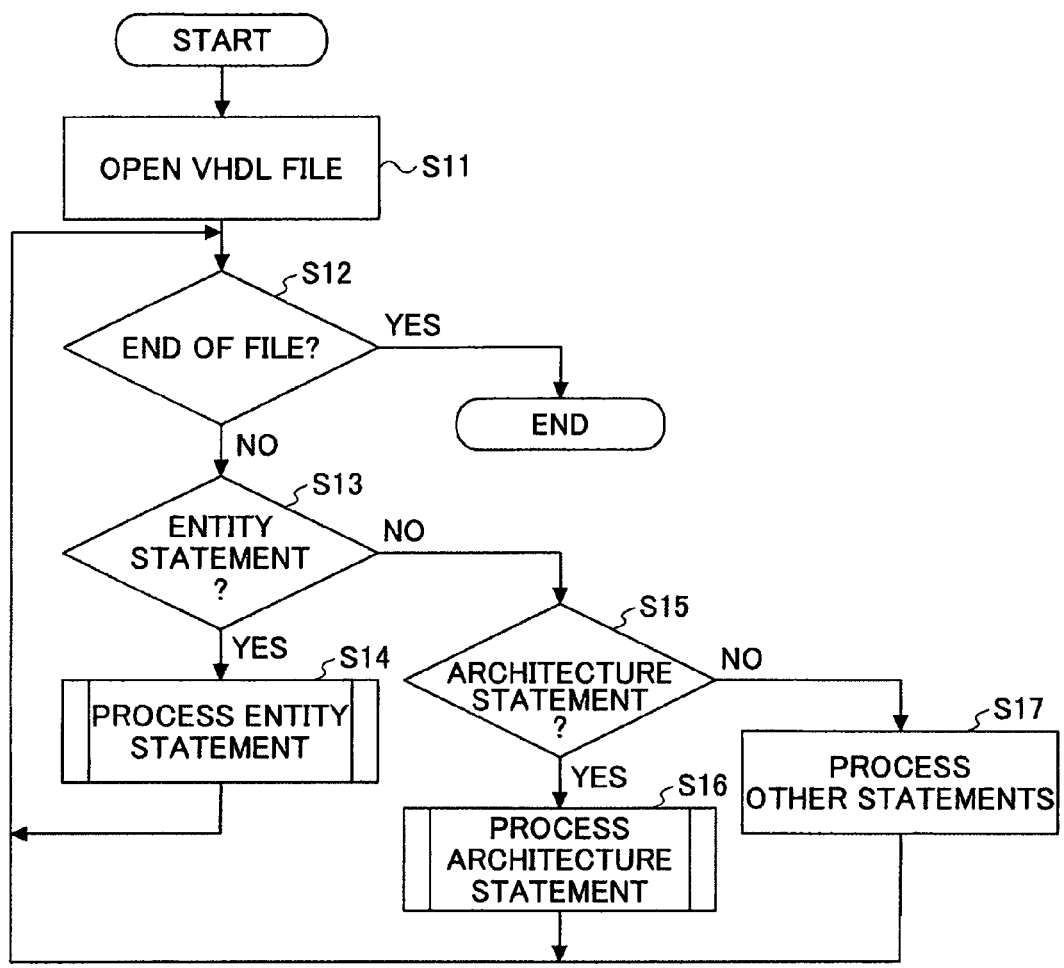
FIG. 3 is a flow chart for explaining the process of a step S1 in more detail.

FIG. 3 is a flow chart for explaining the process of the step S1 shown in FIG. 1 in more detail. In FIG. 3, a step S11 opens the VHDL file, and a step S12 decides whether or not the end of the file is reached. If the decision result in the step S12 is NO, a step S13 decides whether or not an entity statement exists. If the decision result in the step S13 is YES, a step S14 processes, that is, interprets the entity statement, and the process returns to the step S12. On the other hand, if the decision result in the step S13 is NO, a step S15 decides whether or not an architecture statement exists. If the decision result in the step S15 is YES, a step S16 processes, that is, interprets the architecture statement, and the process returns to the step S12. If the decision result in the step S15 is NO, a step S17 processes, that is, interprets other statements, and the process returns to the step S12. The process ends if the decision result in the step S12 becomes YES.

Figure 4:
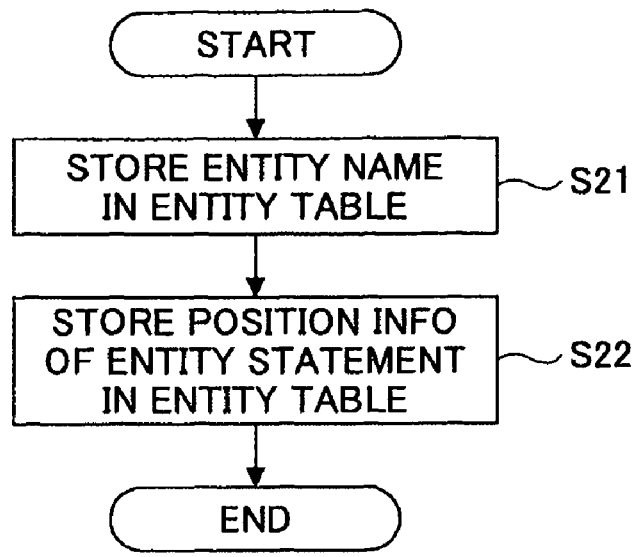
FIG. 4 is a flow chart for explaining the process of a step S14 in more detail.

FIG. 4 is a flow chart for explaining the process of the step S14 shown in FIG. 3, that is, the interpreting of the entity statement, in more detail. In FIG. 4, a step S21 stores the entity name in the corresponding entity table. A step S22 stores the file name, the start line and the end line (position information of the VHDL file) of the entity statement in the entity table, and the process ends.

Figure 5:
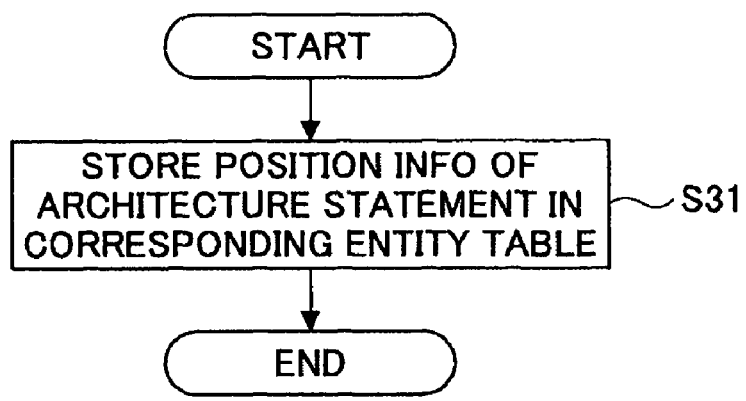
FIG. 5 is a flow chart for explaining the process of a step S16 in more detail.

FIG. 5 is a flow chart for explaining the process of the step S16 shown in FIG. 3, that is, the interpreting of the architecture statement, in more detail. In FIG. 5, a step S31 stores the file name, the start line and the end line (position information of the VHDL file) of the architecture statement in the corresponding entity table, and the process ends.

Accordingly, when the VHDL shown in FIG. 6 is input and the process of the step S1 is carried out, the entity table shown in FIG. 7 is obtained. FIG. 6 is a diagram showing an example of the VHDL which is input, and FIG. 7 is a diagram showing the entity table that is obtained when the VHDL shown in FIG. 6 is input and the process of the step S1 shown in FIG. 1 is carried out.

Figure 8:
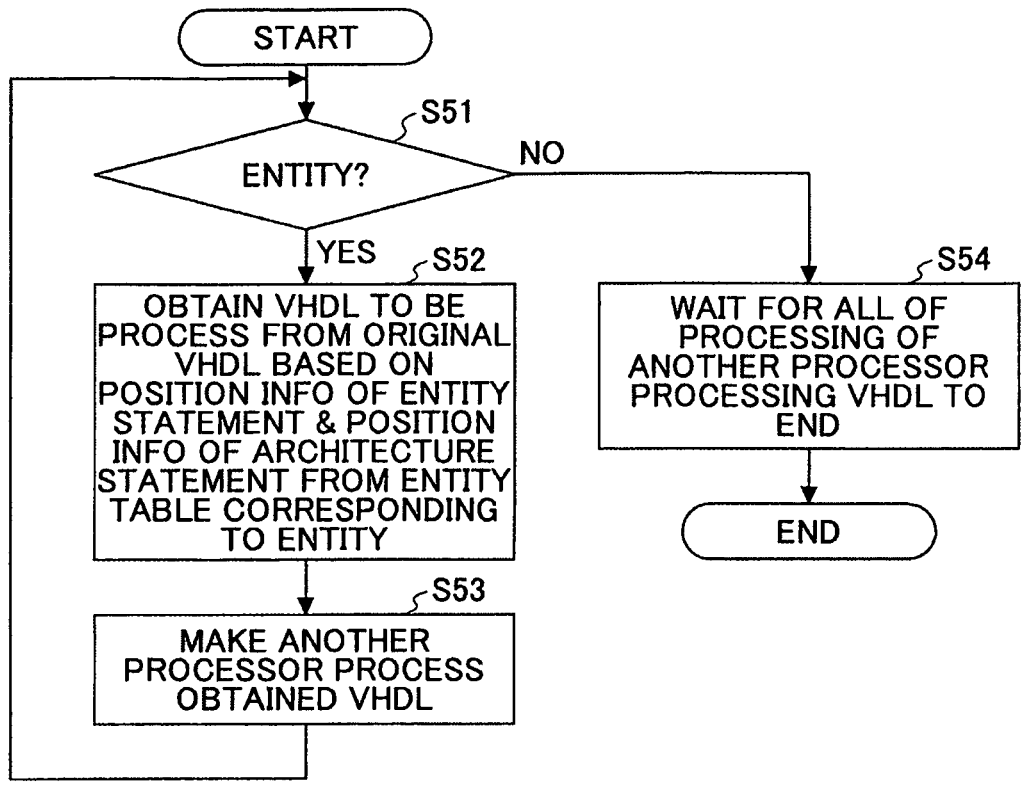
FIG. 8 is a flow chart for explaining the process of a step S2 in more detail.

FIG. 8 is a flow chart for explaining the process of the step S2 shown in FIG. 1 in more detail. In FIG. 8, a step S51 decides whether or not the entities in the entity table exist in an order starting from the entity having the smallest entity number, for example. If the decision result in the step S51 is YES, a step S52 obtains the VHDL (for example, lines 1 to 3 and lines 4 to 9) which is to be processed from the original VHDL (for example, lines 1 to 46), based on the position information of the entity statement and the position information of the architecture statement in the corresponding entity table. A step S53 causes another processor to process the obtained VHDL, and the process returns to the step S51. In other words, even if the processing of the obtained VHDL does not end in the step S53, it is possible to advance to the next process (parallel distributed processing). On the other hand, if the decision result in the step S51 is NO, a step S54 waits for all of the processing of another processor that is processing the VHDL to end, and the process ends.

By the above described process, the parallel distributed processing of the VHDL is executed for each hierarchical level.

Second Embodiment

Next, a description will be given of a second embodiment of the present invention. In this embodiment, the processing of the VHDL for each hierarchical level is executed one at a time.

Figure 9:
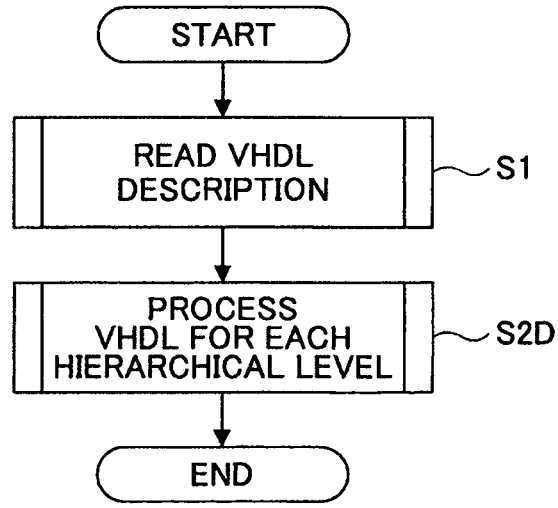
FIG. 9 is a flow chart for explaining a procedure of a second embodiment of the present invention.

FIG. 9 is a flow chart for explaining a procedure of this second embodiment of the present invention. In FIG. 9, those steps that are the same as those corresponding steps in FIG. 1 are designated by the same reference numerals, and a description thereof will be omitted. After the step S1, a step S2D shown in FIG. 9 processes the VHDL for each hierarchical level.

Figure 10:
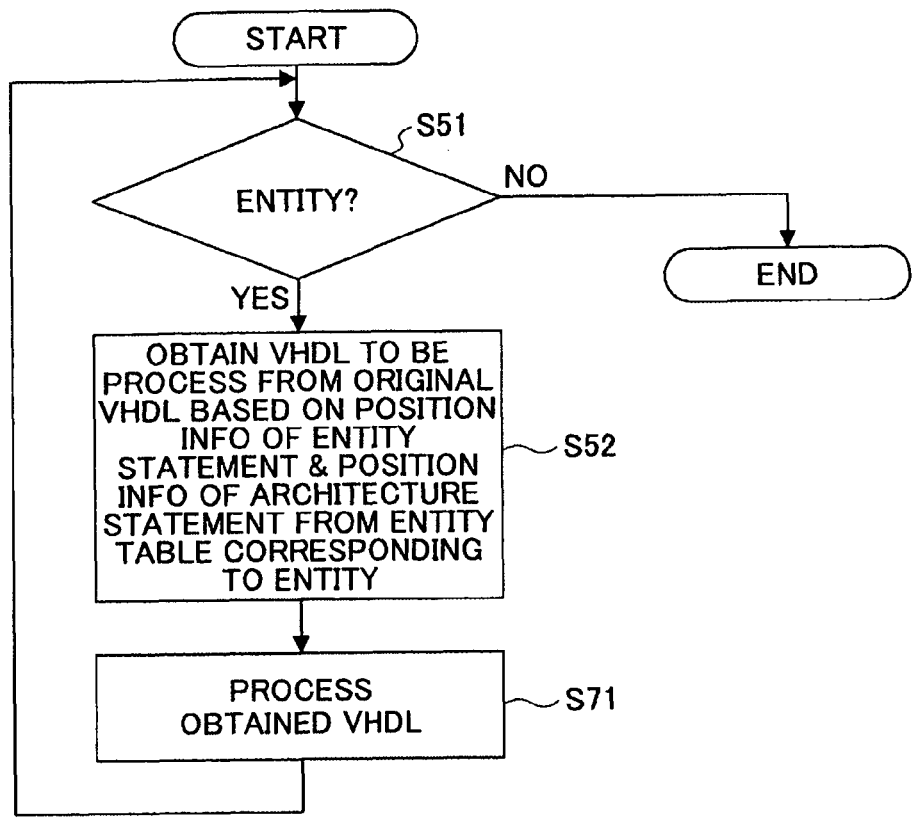
FIG. 10 is a flow chart showing the process of a step S2D in more detail.

FIG. 10 is a flow chart showing the process of the step S2D shown in FIG. 9 in more detail. In FIG. 10, those steps that are the same as those corresponding steps in FIG. 8 are designated by the same reference numerals, and a description thereof will be omitted. In FIG. 10, a step S71 is carried out after the step S52. In addition, the process ends if the decision result in the step S51 is NO. The step S71 successively processes the obtained VHDL, and the process returns to the step S51. In other words, the process will not advance to the next process until the processing of the VHDL ends in the step S71.

By the above described process, the processing of the VHDL for each hierarchical level is executed one at a time.

Third Embodiment

Next, a description will be given of a third embodiment of the present invention. In this embodiment, the parallel distributed processing of the VDHL is executed for each hierarchical level and in an order starting from the low hierarchical level.

Figure 11:
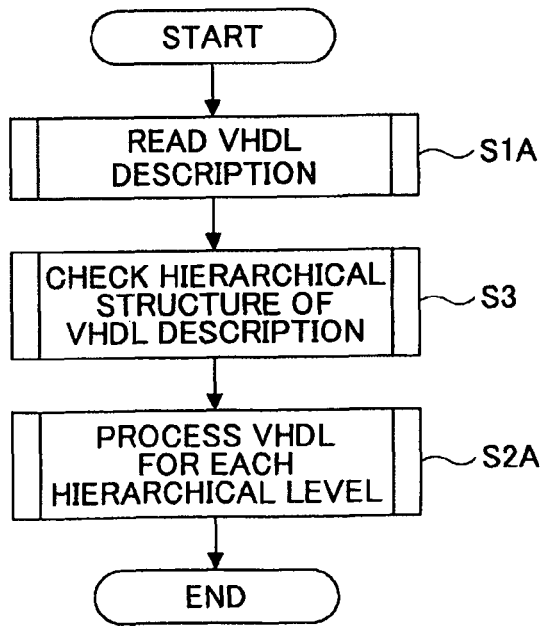
FIG. 11 is a flow chart for explaining a procedure of a third embodiment of the present invention.

FIG. 11 is a flow chart for explaining a procedure of this third embodiment of the present invention. The details of the step S1A shown in FIG. 11 are the same as those of FIG. 3, and in this case, the details of the step S14 shown in FIG. 3 are the same as those of FIG. 4. But in this case, the details of the step S16 shown in FIG. 3 are as shown in FIG. 12.

Figure 12:
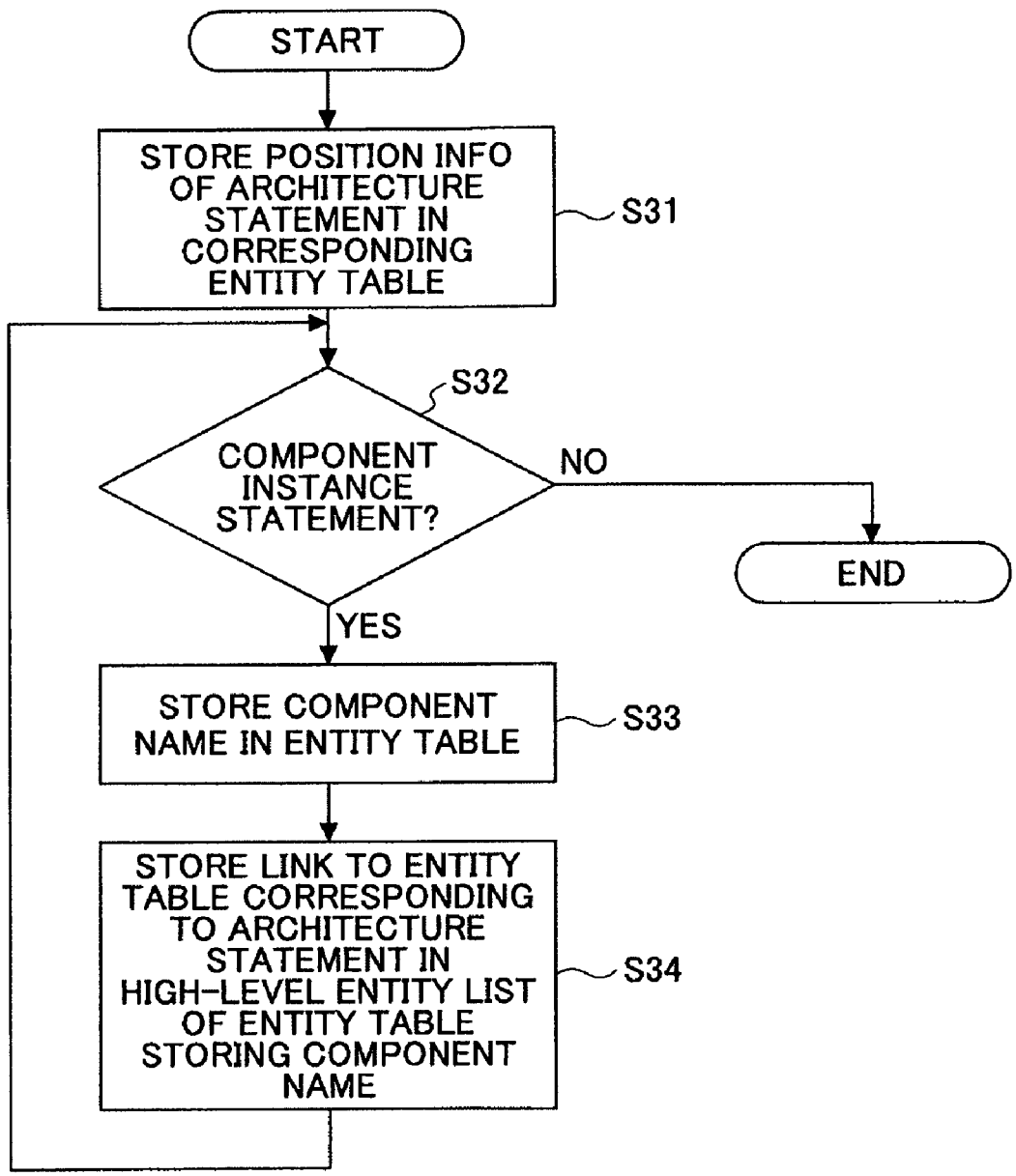
FIG. 12 is a flow chart for explaining the process of a step S16 in more detail.

FIG. 12 is a flow chart for explaining the process of the step S16 shown in FIG. 3 for this third embodiment in more detail. In FIG. 12, those steps that are the same as those corresponding steps in FIG. 5 are designated by the same reference numerals, and a description thereof will be omitted. In FIG. 12, a step S32 decides whether or not a component instance exists within the architecture statement. For example, if component instances such as those indicated by 6 through 8, 16 and 24 shown in FIG. 6 exist within the architecture statement, for example, and the decision result in the step S32 is YES, a step S33 stores the component names in the entity table. In the case of the component instances indicated by 6 through 8, 16 and 24 shown in FIG. 6, component names E2 through E6 are stored in the entity table. A step S34 stores a link to an entity table corresponding to the architecture statement, in a high-level entity list of the entity table storing the component names, and the process returns to the step S32. The process ends if the decision result in the step S32 becomes NO.

FIG. 13 is a diagram showing a data structure of the entity table for a case where the parallel distributed processing of the VHDL is executed in the order starting from the low hierarchical level. The entity table shown in FIG. 13 includes the number (or entity number) allocated to the entity, the entity name, the start line of the entity statement, the end line of the entity statement, the start line of the architecture statement, the end line of the architecture statement, the link to the high-level entity list, the number of low-level entities, the file name of the entity statement, and the file name of the architecture statement. The link to the high-level entity list indicates the number (or table number) allocated to the table (that is, high-level entity list table) which stores a list of the entities in the hierarchical level higher than that of the entity of the entity table. The number of low-level entities indicates the number of entities in the hierarchical level lower than that of the entity of the entity table. The file names in the entity table may be omitted.

Figure 14:
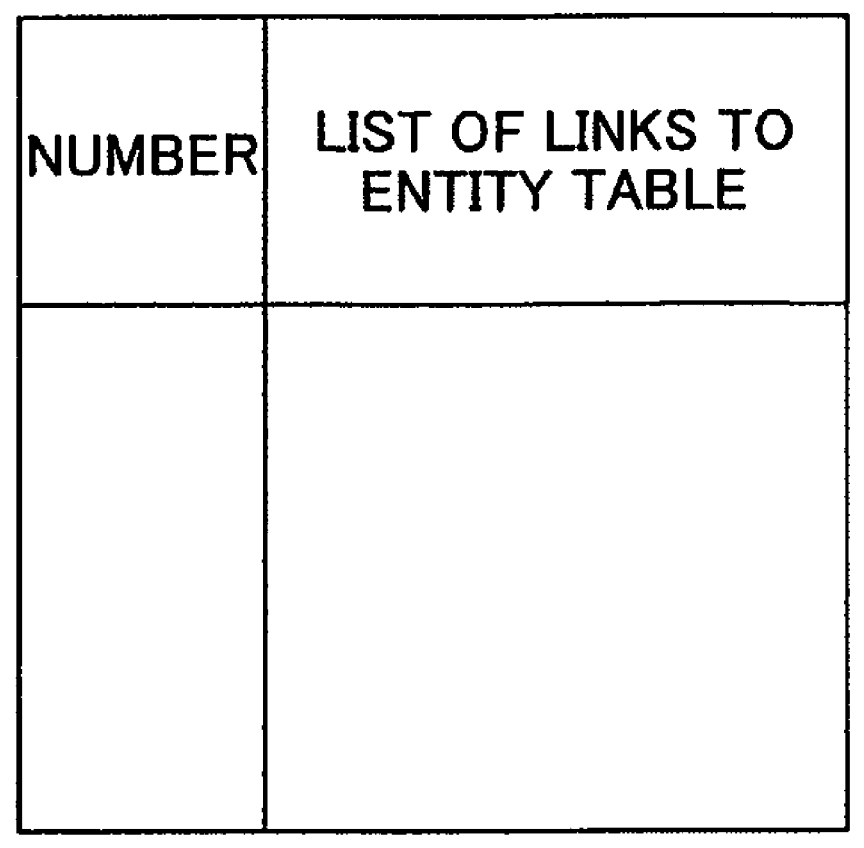

FIG. 14 is a diagram showing a data structure of the high-level entity list table. The high-level entity list table includes the number allocated to the high-level entity list, and the list of the links to the entity tables. The list of the links to the entity table indicates a list of the numbers allocated to the entity tables.

Figures 16, 17:
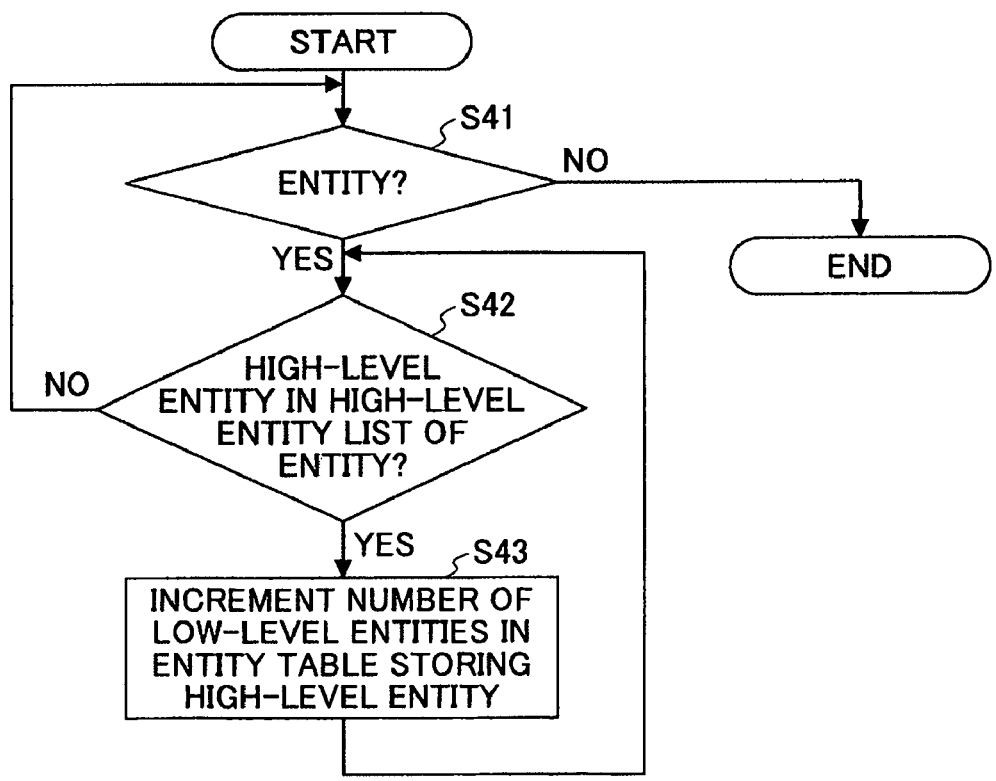
FIG. 16 is a diagram showing the high-level entity list table for the case where the process of the step S1A is carried out.
FIG. 17 is a flow chart showing the process of a step S3 in more detail.

Accordingly, when the VHDL shown in FIG. 6 is input, the parallel distributed processing of the VHDL in the order starting from the low hierarchical level for each hierarchical level is executed, and the process of the step S1A shown in FIG. 11 is carried out, the entity table becomes as shown in FIG. 15, and the high-level entity list table becomes as shown in FIG. 16. FIG. 15 is a diagram showing the entity table for the case where the process of the step S1A is carried out, and FIG. 16 is a diagram showing the high-level entity list table for the case where the process of the step S1A is carried out. In FIG. 15, links 1 through 5 to the high-level entity list respectively correspond to the numbers 1 through 5 of the high-level entity list shown in FIG. 16. In addition, lists 1, 2 and 3 of the links to the entity tables shown in FIG. 16 respectively correspond to the entity numbers 1, 2 and 3 shown in FIG. 15.

FIG. 17 is a flow chart showing the process of the step S3 shown in FIG. 11 in more detail. In FIG. 17, a step S41 decides whether or not the entities in the entity table exist in the order starting from the entity having the smallest entity number, for example. If the decision result in the step S41 is YES, a step S42 decides whether or not a high-level entity exits in the high-level entity list of the entity. The process returns to the step S41 if the decision result in the step S42 is NO. If the decision result in the step S42 is YES, a step S43 increments by one the number of low-level entities of the entity table having the high-level entity, and the process returns to the step S42. The process ends if the decision result in the step S41 becomes NO. The number of low-level entities for each entity is computed in the above described manner. Accordingly, when the VHDL shown in FIG. 6 is input, the parallel distributed processing of the VHDL in the order starting from the low hierarchical level for each hierarchical level is executed, and the processes of the steps S1A and S3 shown in FIG. 11 are carried out, the entity table becomes as shown in FIG. 18. FIG. 18 is a diagram showing the entity table for the case where the process of the step S3 is carried out.

Figure 19:
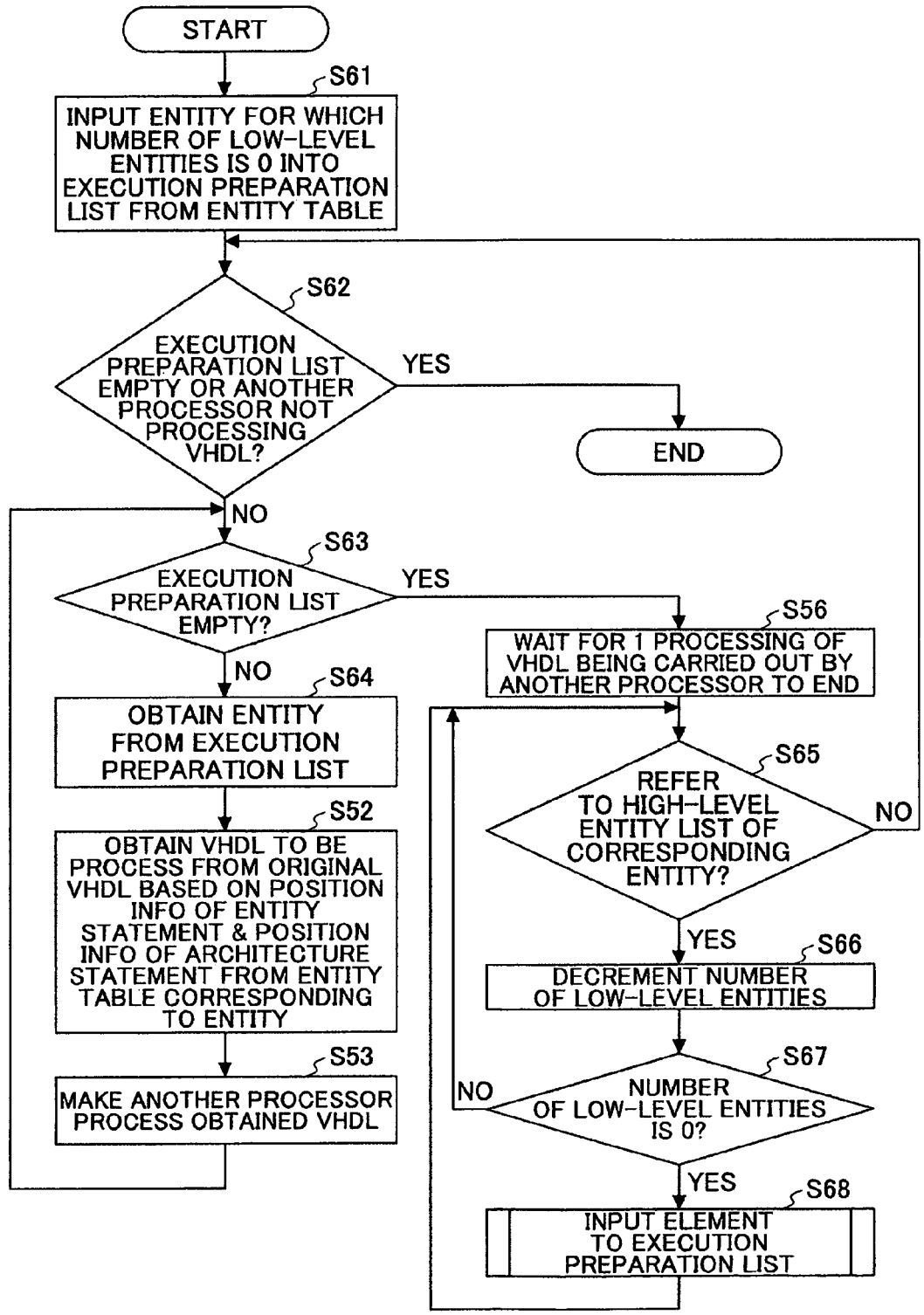
FIG. 19 is a flow chart for explaining the process of a step S2A in more detail.
Figure 20:
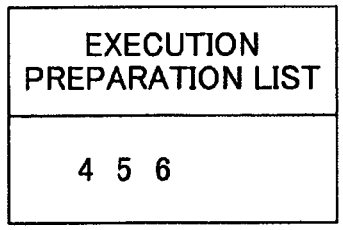
FIG. 20 is a diagram showing an execution preparation list.

FIG. 19 is a flow chart for explaining the process of the step S2A shown in FIG. 11 in more detail for a case where the VHDL shown in FIG. 6 is input and the parallel distributed processing of the VHDL in the order starting from the low hierarchical level for each hierarchical level is executed. In FIG. 19, a step S61 creates an execution preparation list shown in FIG. 20 which is input with the entities for which the number of low-level entities is 0 from the entity table. FIG. 20 is a diagram showing the execution preparation list. A step S62 decides whether the execution preparation list is empty or, the VHDL is not being processed by another processor. In this example, the execution preparation list is not empty, and thus, the decision result in the step S62 is NO, and the process advances to a step S63. The step S63 decides whether or not the execution preparation list is empty, and since the decision result is NO in this case, the process advances to a step S64.

Figure 21:
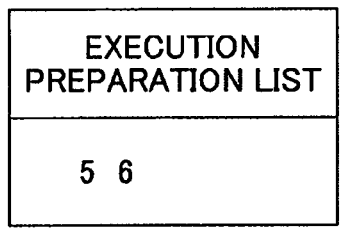
FIG. 21 is a diagram showing the execution preparation list for a case where a step S64 is carried out.

The step S64 obtains the first element, that is, the number of the first entity table, from the execution preparation list. In the case of the execution preparation list shown in FIG. 20, the first element, that is, the number of the first entity table is "4". Hence, the process advances to the next step S52 by holding the obtained element (number of the entity table) "4". In this state, the execution preparation list becomes as shown in FIG. 21. FIG. 21 is a diagram showing the execution preparation list for a case where the step S64 is carried out. The steps S52 and S53 are the same as the steps S52 and S53 shown in FIG. 8, and the process returns to the step S63 after the steps S53.

Figure 22:
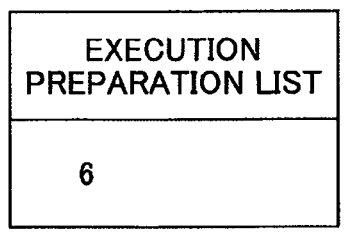
FIG. 22 is a diagram showing the execution preparation list for a case where the process of the step S64 is carried out for the second time.

The decision result in the step S63 is NO again, and the step S64 obtains the first element "5", that is, the number "5" of the first entity table, from the execution preparation list shown in FIG. 21. Hence, the process advances to the next step S52 by holding the obtained element (number of the entity table) "5". In this state, the execution preparation list becomes as shown in FIG. 22. FIG. 22 is a diagram showing the execution preparation list for a case where the step S64 is carried out for the second time. After the steps S52 and S53, the process returns to the step S63.

Figure 23:
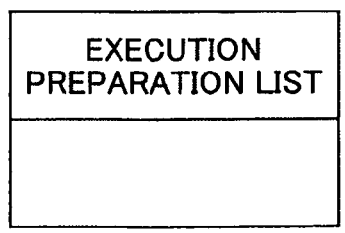
FIG. 23 is a diagram showing the execution preparation list for a case where the process of the step S64 is carried out for the third time.

The decision result in the step S63 is NO again, and the step S64 obtains the first element "6", that is, the number "6" of the first entity table, from the execution preparation list shown in FIG. 22. Hence, the process advances to the next step S52 by holding the obtained element (number of the entity table) "6". In this state, the execution preparation list becomes as shown in FIG. 23. FIG. 23 is a diagram showing the execution preparation list for a case where the step S64 is carried out for the third time. After the steps S52 and S53, and the process returns to the step S63.

This time, the decision result in the step S63 is YES, and the process advances to a step S56. The step S56 waits for one processing of the VHDL that is being carried out by another processor in the step S53 to end. A step S65 refers to the high-level entity list of the corresponding entity, and decides whether or not an element of the list corresponding to the number of the entity table exists in the high-level entity list. If the processing of the VHDL corresponding to the entity "4" in the entity table ends in the step S56, the decision result in the step S65 becomes YES because the link to the high-level entity list is "3" for the entity number "4" in the entity table shown in FIG. 18, and the step S65 refers to the element "1" of the list having the number "3" in the high-level entity list of the high-level entity list table shown in FIG. 16. A step S66 decrements by one only the number of low-level entities for the number "1" in the entity table corresponding to the element "1". In this state, the entity table becomes as shown in FIG. 24. FIG. 24 is a diagram showing the entity table for the case where the step S66 is carried out.

A step S67 decides whether or not the number of low-level entities is 0, and because the decision result is NO in this case, the process returns to the step S65. In this case, there is no element for the list corresponding to the number of the entity table and the decision result in the step S65 is NO, and the process therefore returns to the step S62. In this state, another processor is processing the VHDL (entities having the numbers "5" and "6" in the entity table) and the decision result in the step S62 is NO, and the process therefore advances to the step S63. In this case, the decision result in the step S63 is YES because the execution preparation list is empty, and the process advances to the step S56.

If the processing of the VHDL corresponding to the entity having the number "5" in the entity table ends in the step S56, the decision result in the step S65 becomes YES, because the link to the high-level entity list is "4" for the entity number "5" in the entity table shown in FIG. 24, and the step S65 refers to the element "2" of the list having the number "4" in the high-level entity list of the high-level entity list table shown in FIG. 16. The step S66 decrements by one only the number of low-level entities for the number "2" in the entity table corresponding to the element "2". In this state, the entity table becomes as shown in FIG. 25. FIG. 25 is a diagram showing the entity table for the case where the step S66 is carried out.

Figure 26:
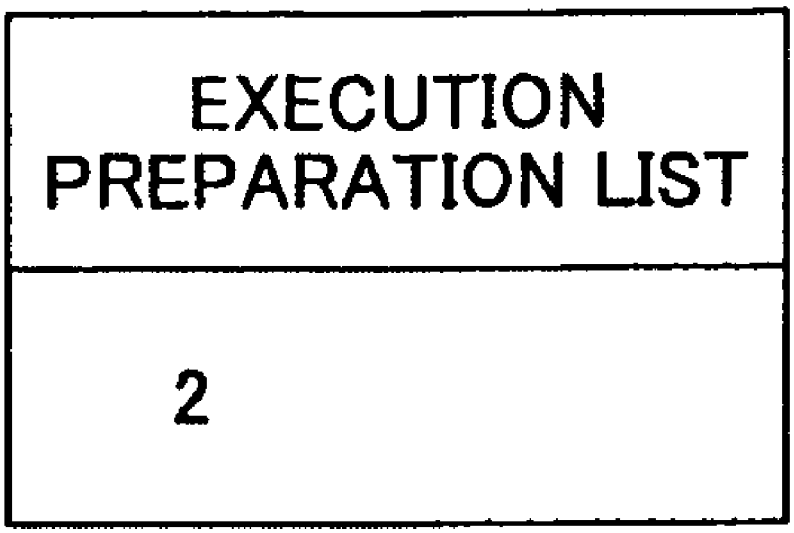
FIG. 26 is a diagram showing the execution preparation list for a case where a step S68 is carried out.

The step S67 decides whether or not the number of low-level entities is 0, and because the decision result is YES in this case, the process advances to the step S68. The step S68 inputs the element "2" in the execution preparation list, and the process returns to the step S65. In this state, the execution preparation list becomes as shown in FIG. 26. FIG. 26 is a diagram showing the execution preparation list for the case where the step S68 is carried out.

The decision result in the step S65 becomes NO when there is no more list to refer to, and the process returns to the step S62. In this case, the decision result in the step S62 becomes NO because the execution preparation list is not empty, and the process advances to the step S63. The decision result in the step S63 becomes NO because the execution preparation list is not empty, and the process advances to the step S64. The step S64 obtains the first element "2" in the execution preparation list. In this state, the execution preparation list becomes as shown in FIG. 23. After the steps S52 and S53, the decision result in the step S63 becomes YES because the execution preparation list is empty, and the process advances to the step S56.

If the processing of the VHDL corresponding to the entity having the number "6" in the entity table ends in the step S56, the decision result in the step S65 becomes YES, because the link to the high-level entity list is "5" for the entity number "6" in the entity table shown in FIG. 25, and the step S65 refers to the element "3" of the list having the number "5" in the high-level entity list of the high-level entity list table shown in FIG. 16. The step S66 decrements by one only the number of low-level entities for the number "3" in the entity table corresponding to the element "3". In this state, the entity table becomes as shown in FIG. 27. FIG. 27 is a diagram showing the entity table for the case where the step S66 is carried out.

Figure 28:
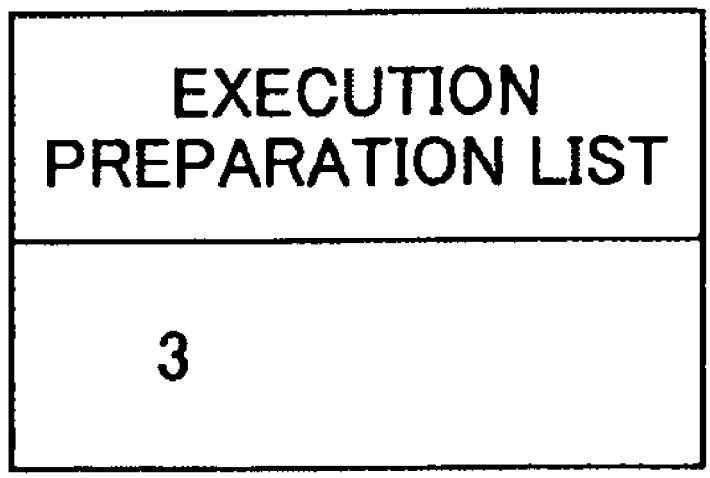
FIG. 28 is a diagram showing the execution preparation list for the case where the step S68 is carried out.

The step S67 decides whether or not the number of low-level entities is 0, and because the decision result is YES in this case, the process advances to the step S68. The step S68 inputs the element "3" in the execution preparation list, and the process returns to the step S65. In this state, the execution preparation list becomes as shown in FIG. 28. FIG. 28 is a diagram showing the execution preparation list for the case where the step S68 is carried out.

The decision result in the step S65 becomes NO because there is no more list to refer to, and the process returns to the step S62. In this case, the decision result in the step S62 becomes NO because the execution preparation list is not empty, and the process advances to the step S63. The decision result in the step S63 becomes NO because the execution preparation list is not empty, and the process advances to the step S64. The step S64 obtains the first element "3" in the execution preparation list. In this state, the execution preparation list becomes as shown in FIG. 23. After the steps S52 and S53, the decision result in the step S63 becomes YES because the execution preparation list is empty, and the process advances to the step S56.

If the processing of the VHDL corresponding to the entity having the number "2" in the entity table ends in the step S56, the decision result in the step S65 becomes YES, because the link to the high-level entity list is "1" for the entity number "2" in the entity table shown in FIG. 27, and the step S65 refers to the element "1" of the list having the number "1" in the high-level entity list of the high-level entity list table shown in FIG. 16. The step S66 decrements by one only the number of low-level entities for the number "1" in the entity table corresponding to the element "1". In this state, the entity table becomes as shown in FIG. 29. FIG. 29 is a diagram showing the entity table for the case where the step S66 is carried out.

The step S67 decides whether or not the number of low-level entities is 0, and because the decision result is NO in this case, the process returns to the step S65. The decision result in the step S65 becomes NO because there is no more list to refer to, and the process returns to the step S62. In this state, another processor is processing the VHDL (entity having the number "3" in the entity table), and thus, the decision result in the step S62 becomes NO and the process advances to the step S63. The decision result in the step S63 becomes YES because the execution preparation list is empty, and the process advances to the step S56.

If the processing of the VHDL corresponding to the entity having the number "3" in the entity table ends in the step S56, the decision result in the step S65 becomes YES, because the link to the high-level entity list is "3" for the entity number "3" in the entity table shown in FIG. 29, and the step S65 refers to the element "1" of the list having the number 311 in the high-level entity list of the high-level entity list table shown in FIG. 16. The step S66 decrements by one only the number of low-level entities for the number "1" in the entity table corresponding to the element "1". In this state, the entity table becomes as shown in FIG. 30. FIG. 30 is a diagram showing the entity table for the case where the step S66 is carried out.

Figure 31:
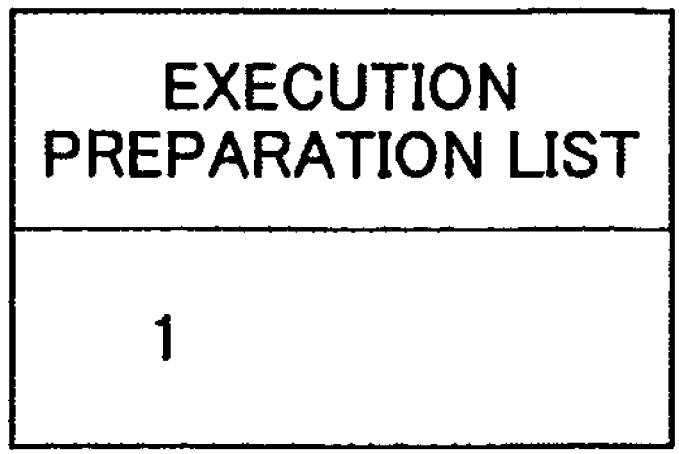
FIG. 31 is a diagram showing the execution preparation list for the case where the step S68 is carried out.

The step S67 decides whether or not the number of low-level entities is 0, and because the decision result is YES in this case, the process advances to the step S68. The step S68 inputs the element "1" to the execution preparation list, and the process returns to the step S65. In this state, the execution preparation list becomes as shown in FIG. 31. FIG. 31 is a diagram showing the execution preparation list for the case where the step S68 is carried out.

The decision result in the step S65 becomes NO because there is no more list to refer to, and the process returns to the step S62. In this state, the decision result in the step S62 becomes NO because the execution preparation list is not empty, and the process advances to the step S63. The decision result in the step S63 becomes NO because the execution preparation list is not empty, and the process advances to the step S64. The step S64 obtains the first element "2" from the execution preparation list. In this state, the execution preparation list becomes as shown in FIG. 23. After the steps S52 and S53, the decision result in the step S63 becomes YES because the execution preparation list is empty, and the process advances to the step S56.

If the processing of the VHDL corresponding to the entity having the number "1" in the entity table ends in the step S56, the decision result in the step S65 becomes NO, because there is no link to the high-level entity list for the entity number "1" in the entity table shown in FIG. 30, and the process returns to the step S62. In this case, the decision result in the step S62 becomes YES because the execution preparation list is empty and the VHDL is not being processed by another processor, and the process ends.

Figure 32:
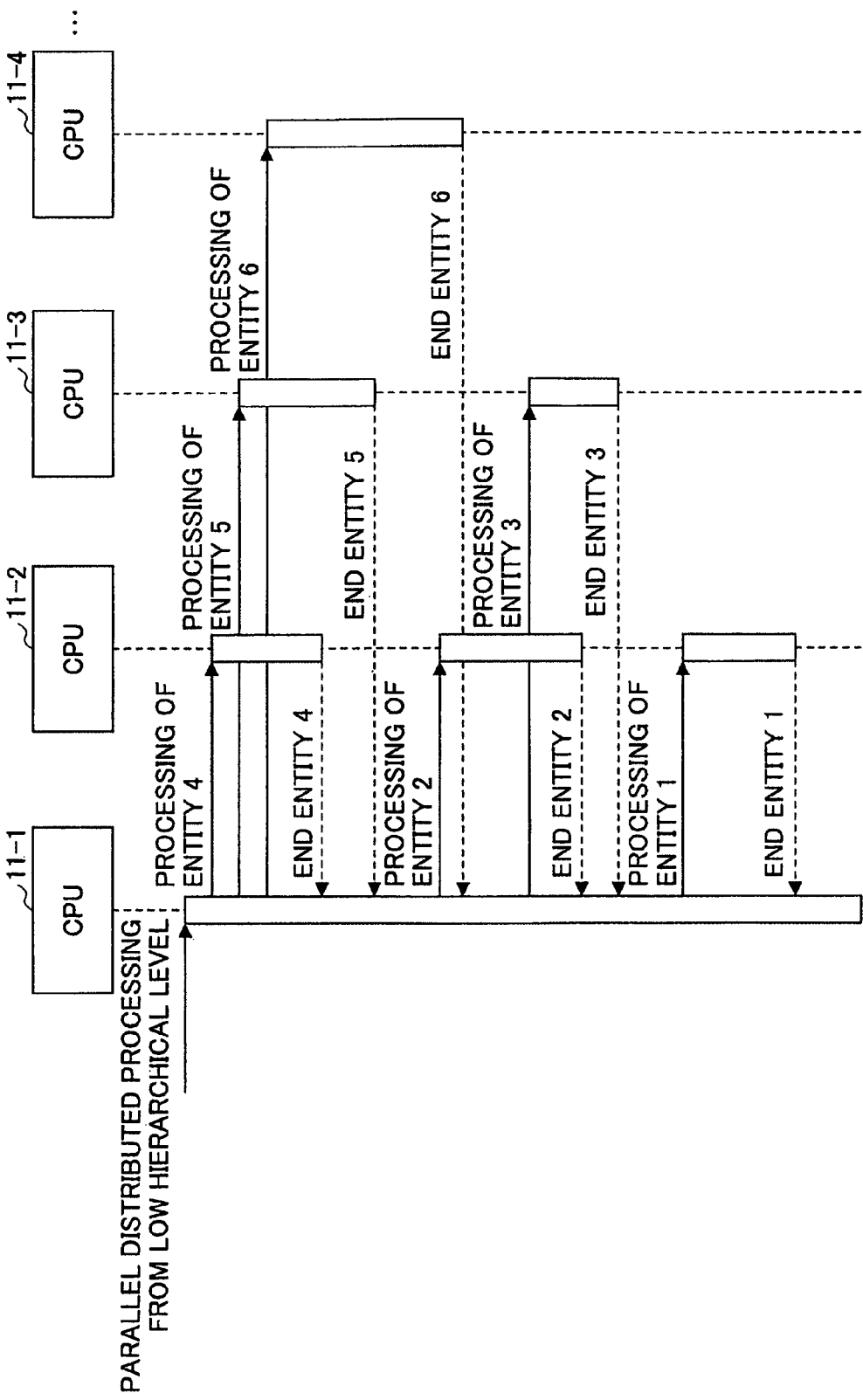
FIG. 32 is a diagram showing a sequence in which entities are subjected to parallel distributed processing.

FIG. 32 is a diagram showing a sequence in which the entities are subjected to parallel distributed processing. In FIG. 32, reference numerals 11-1, 11-2, . . . denote CPUs.

By the above described process, the parallel distributed processing of the VHDL is executed for each hierarchical level in the order starting from the low hierarchical level.

Fourth Embodiment

Next, a description will be given of a fourth embodiment of the present invention. In this embodiment, the parallel distributed processing of the VDHL is executed one at a time for each hierarchical level and in an order starting from the low hierarchical level.

Figure 33:
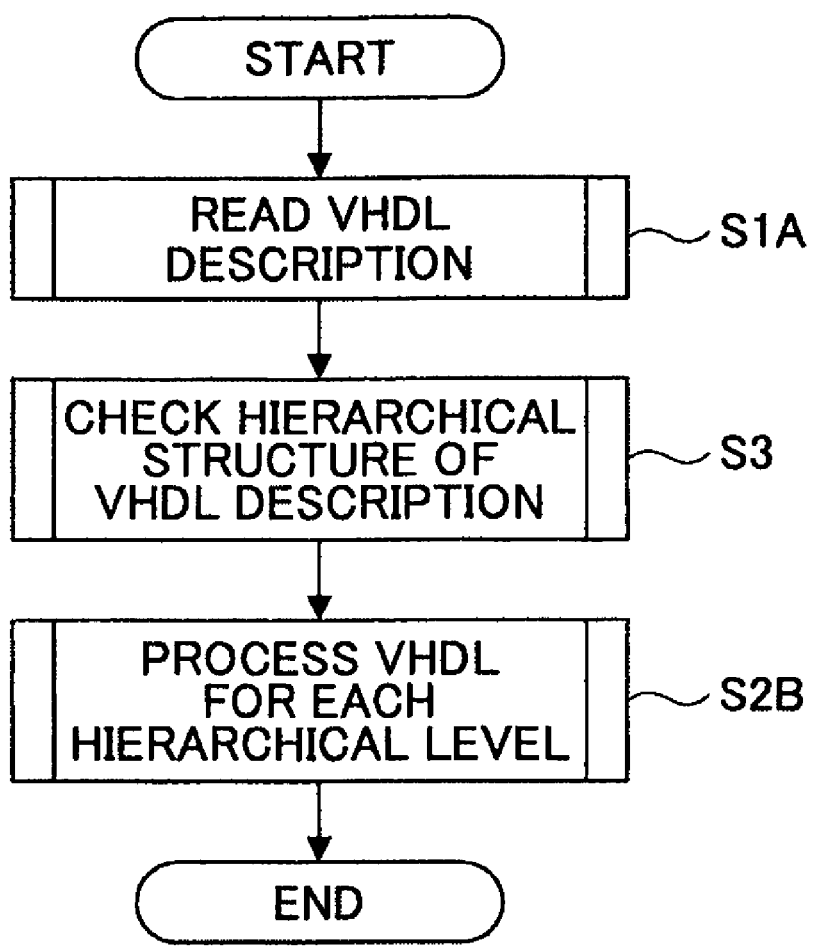
FIG. 33 is a flow chart for explaining a procedure of a fourth embodiment of the present invention.

FIG. 33 is a flow chart for explaining a procedure of this fourth embodiment of the present invention. In FIG. 33, those steps that are the same as those corresponding steps in FIG. 11 are designated by the same reference numerals, and a description thereof will be omitted. The details of a step S2B shown in FIG. 33 are as shown in FIG. 34.

Figure 34:
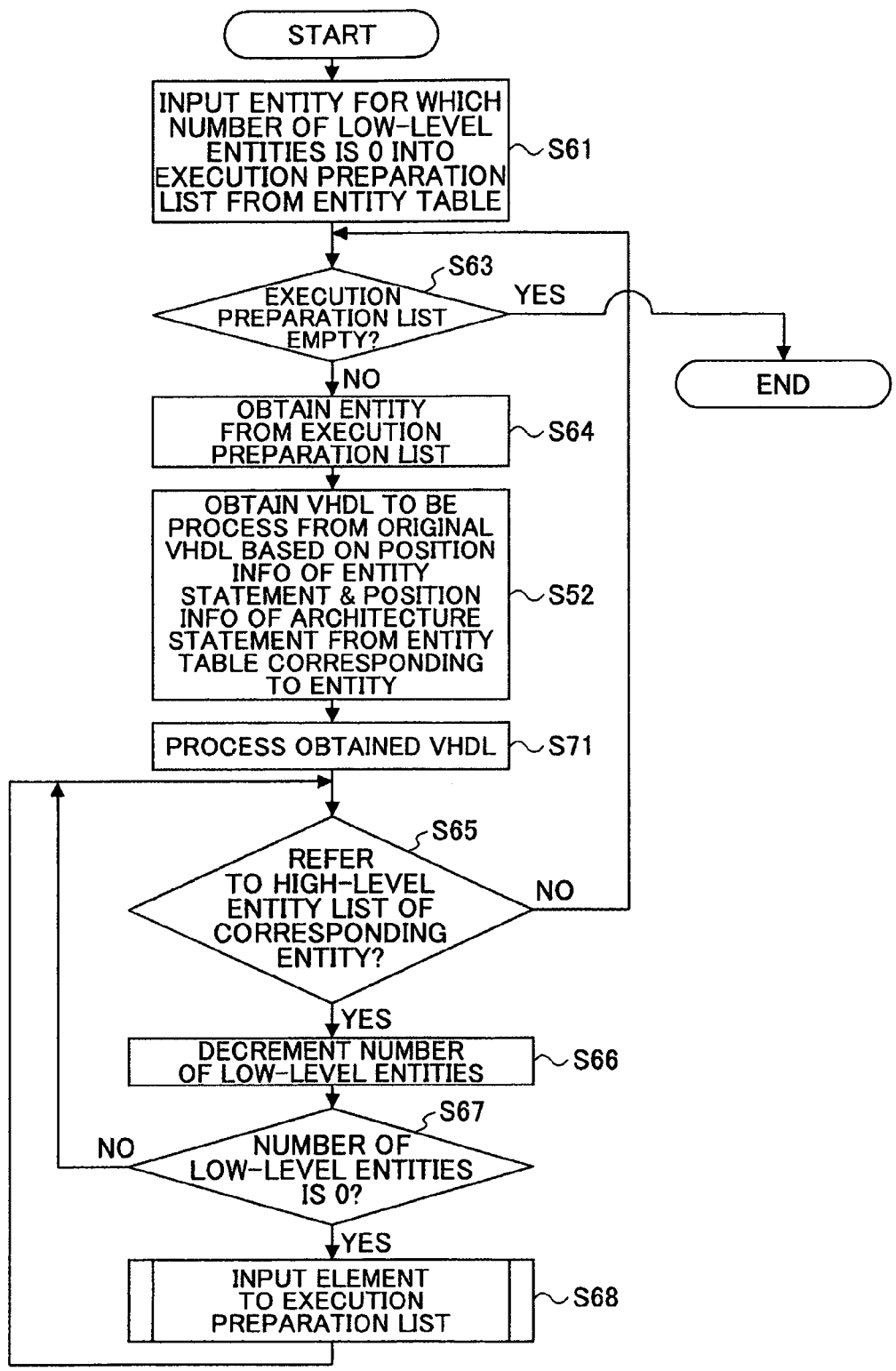
FIG. 34 is a flow chart for explaining the process of a step S2B in more detail.

FIG. 34 is a flow chart for explaining the process of the step S2B shown in FIG. 33 in more detail. In FIG. 34, those steps that are the same as those corresponding steps in FIGS. 10 and 19 are designated by the same reference numerals, and a description thereof will be omitted.

By carrying out the process shown in FIG. 34 in the step S2B shown in FIG. 33, the parallel distributed processing of the VDHL is executed one at a time for each hierarchical level and in the order starting from the low hierarchical level.

Fifth Embodiment

Next, a description will be given of a fifth embodiment of the present invention. In this embodiment, the parallel distributed processing of the VDHL is executed for each hierarchical level and in an order starting from the low hierarchical level, but with a limit on the number of parallel processes.

Figure 35:
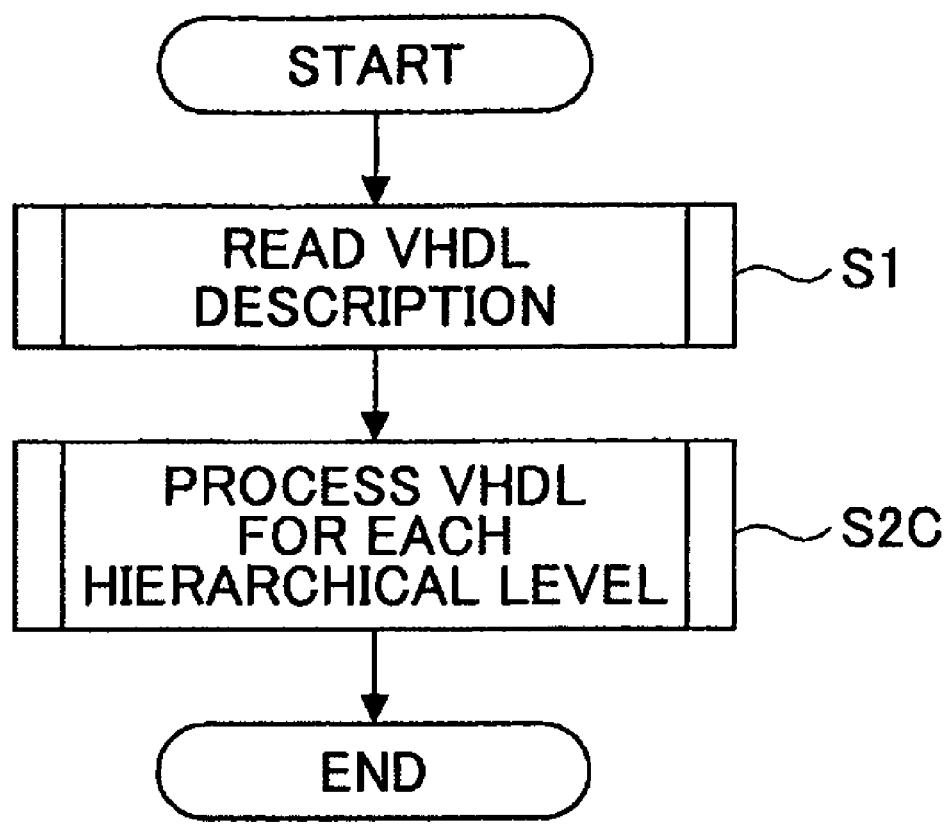
FIG. 35 is a flow chart for explaining a procedure of a fifth embodiment of the present invention.

FIG. 35 is a flow chart for explaining a procedure of this fifth embodiment of the present invention. In FIG. 35, those steps that are the same as those corresponding steps in FIG. 1 are designated by the same reference numerals, and a description thereof will be omitted. The details of a step S2C shown in FIG. 35 are as shown in FIG. 36.

Figure 36:
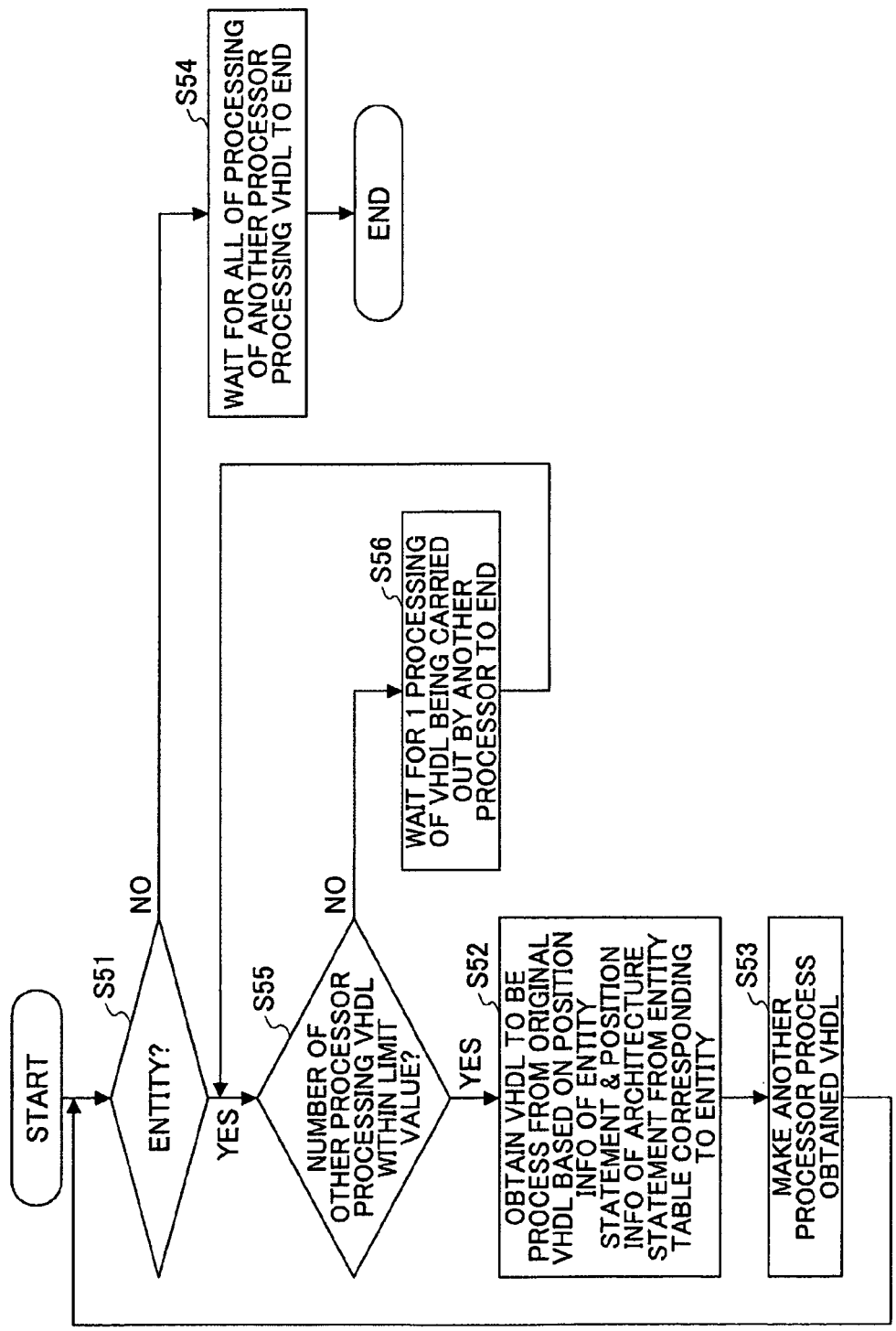
FIG. 36 is a flow chart for explaining the process of a step S2C in more detail.

FIG. 36 is a flow chart for explaining the process of the step S2C shown in FIG. 35 in more detail. In FIG. 36, those steps that are the same as those corresponding steps in FIGS. 8 and 19 are designated by the same reference numerals, and a description thereof will be omitted. In FIG. 36, a step S55 decides whether or not the number of other processor processing the VHDL is within a limit number. The process advances to the step S52 if the decision result in the step S55 is YES, and the process advances to the step S56 if the decision result in the step S55 is NO. The limit number may be set arbitrarily.

By carrying out the process shown in FIG. 36 in the step S2C shown in FIG. 35, the parallel distributed processing of the VDHL is executed for each hierarchical level and in the order starting from the low hierarchical level, but with a limit on the number of parallel processes.

Sixth Embodiment

Next, a description will be given of a sixth embodiment of the present invention. In this embodiment, the parallel distributed processing of the VDHL is executed for each hierarchical level and in an order starting from the low hierarchical level, but with a limit on the number of parallel processes.

Figure 37:
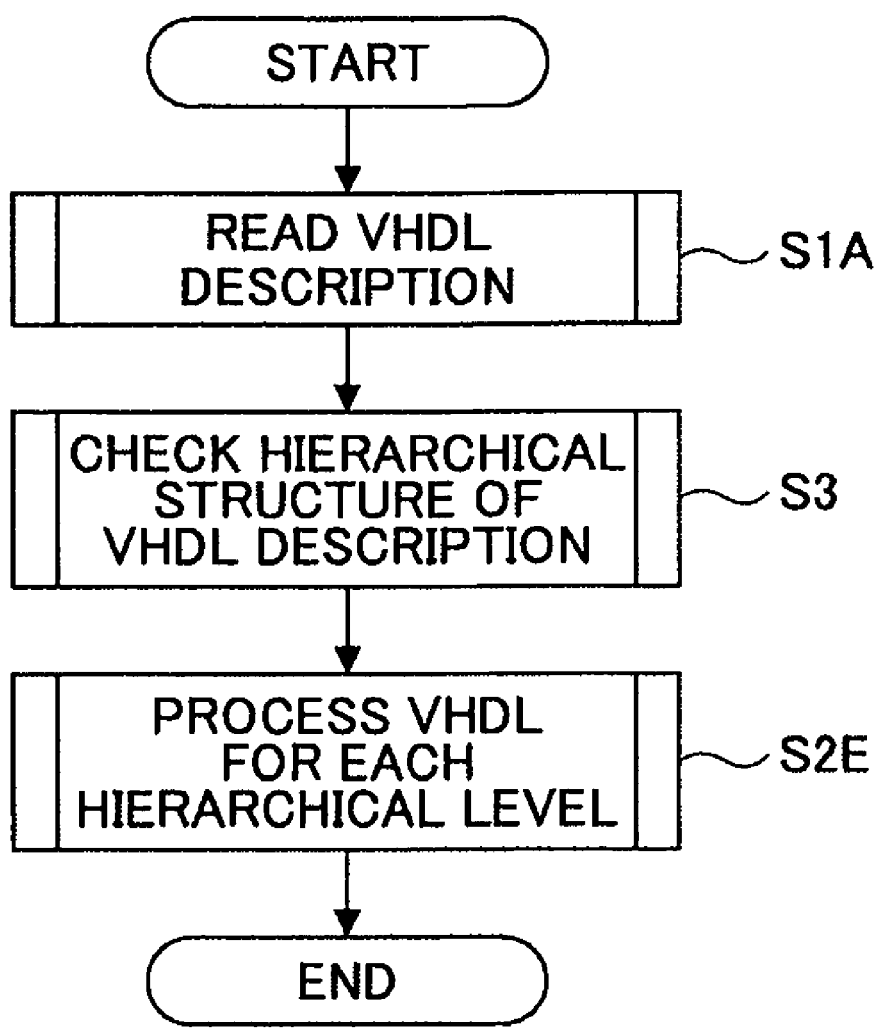
FIG. 37 is a flow chart for explaining a procedure of a sixth embodiment of the present invention.

FIG. 37 is a flow chart for explaining a procedure of this sixth embodiment of the present invention. In FIG. 37, those steps that are the same as those corresponding steps in FIG. 11 are designated by the same reference numerals, and a description thereof will be omitted. The details of a step S2E shown in FIG. 37 are as shown in FIG. 38.

Figure 38:
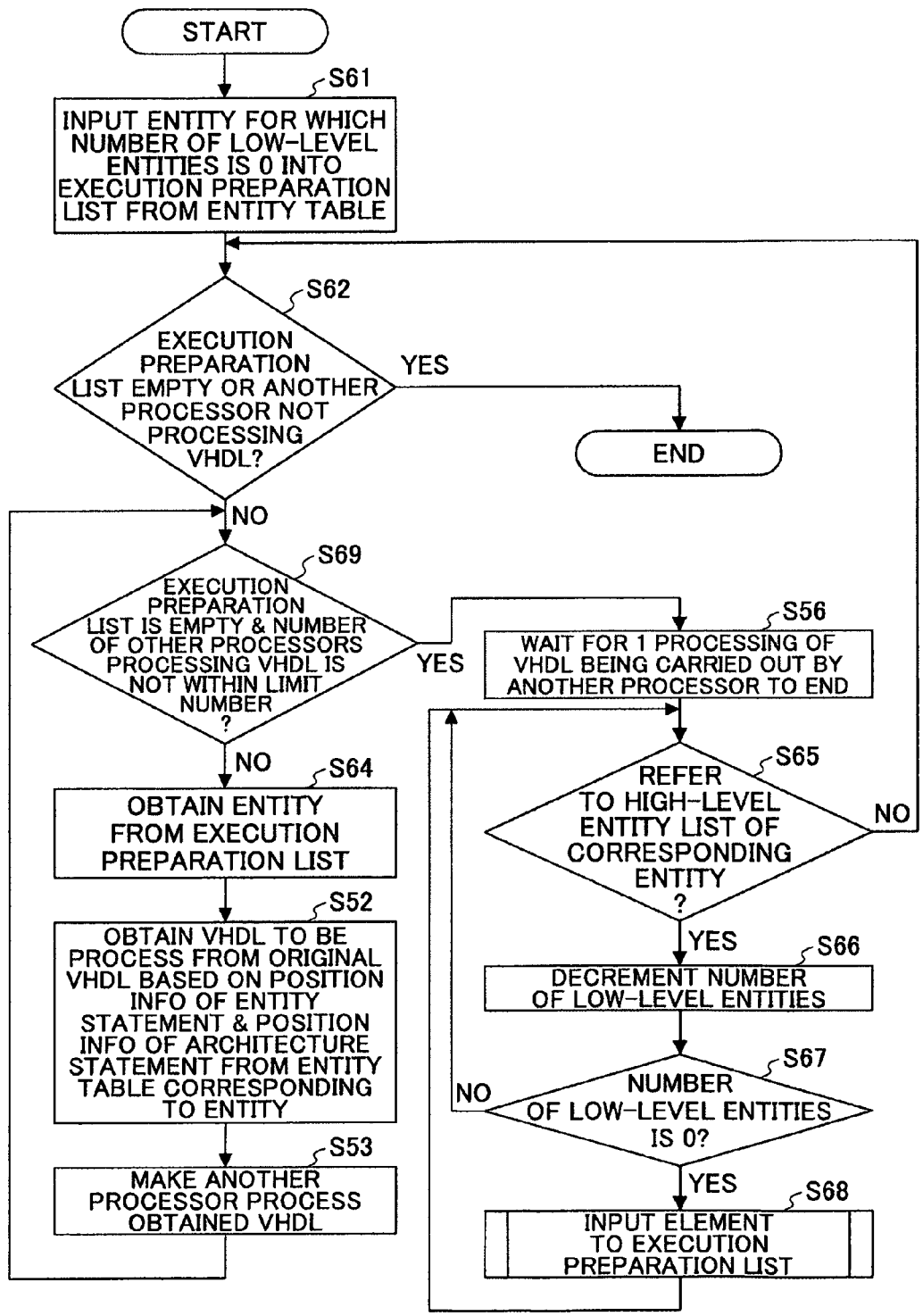
FIG. 38 is a flow chart for explaining the process of a step S2E in more detail.

FIG. 38 is a flow chart for explaining the process of the step S2E shown in FIG. 37 in more detail. In FIG. 38, those steps that are the same as those corresponding steps in FIG. 19 are designated by the same reference numerals, and a description thereof will be omitted. In FIG. 38, a step S69 is provided in place of the step S63 shown in FIG. 19. The step decides whether the execution preparation list is empty and the number of other processors processing the VHDL is not within the limit number. If the execution preparation list is not empty and the number of other processors processing the VHDL is not within the limit number, the decision result in the step S69 becomes NO and the process advances to the step S52. On the other hand, if the decision result in the step S69 is YES, the process advances to the step S56.

By carrying out the process shown in FIG. 38 in the step S2E shown in FIG. 37, the parallel distributed processing of the VDHL is executed for each hierarchical level and in the order starting from the low hierarchical level, but with a limit on the number of parallel processes.

[Modification]

In the case of any of the third, fourth and sixth embodiments in which the processing of the VDHL is executed for each hierarchical level and in the order starting from the low hierarchical level, the execution sequence of the processing may be determined by priority, which may be (I) a priority according to the width of hierarchical level (or hierarchical width), (II) a priority according to the depth of hierarchical level (or hierarchical width) or, (III) a priority from a hierarchical level far away from a highest hierarchical level (that is, a priority according to the farthest hierarchical level). The execution sequences (I), (II) and (III) of the processing may be selected or switched in the step S68 shown in FIGS. 19, 34 and 39.

Figure 39:
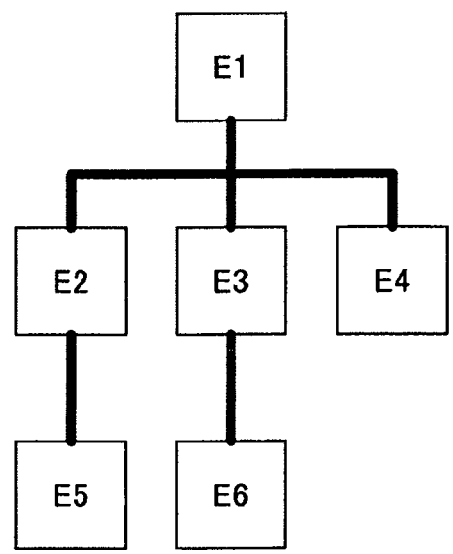
FIG. 39 is a diagram showing a hierarchical structure of entities E1 through E6.
Figure 40:
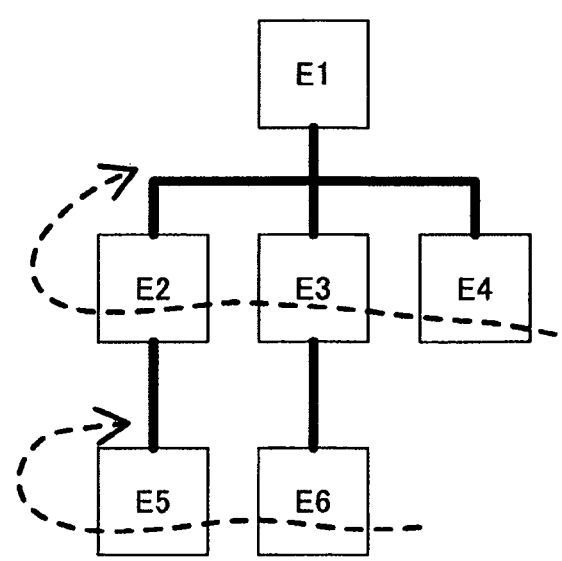
FIG. 40 is a diagram showing an execution sequence for a case where the priority of the execution sequence is the width.
Figure 41:
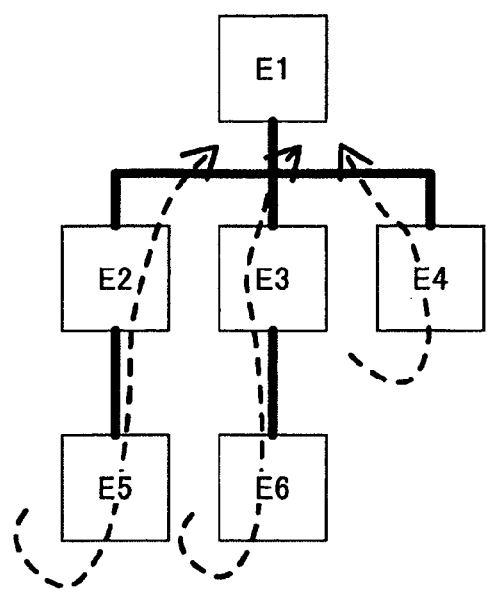
FIG. 41 is a diagram showing an execution sequence for a case where the priority of the execution sequence is the depth.
Figure 42:
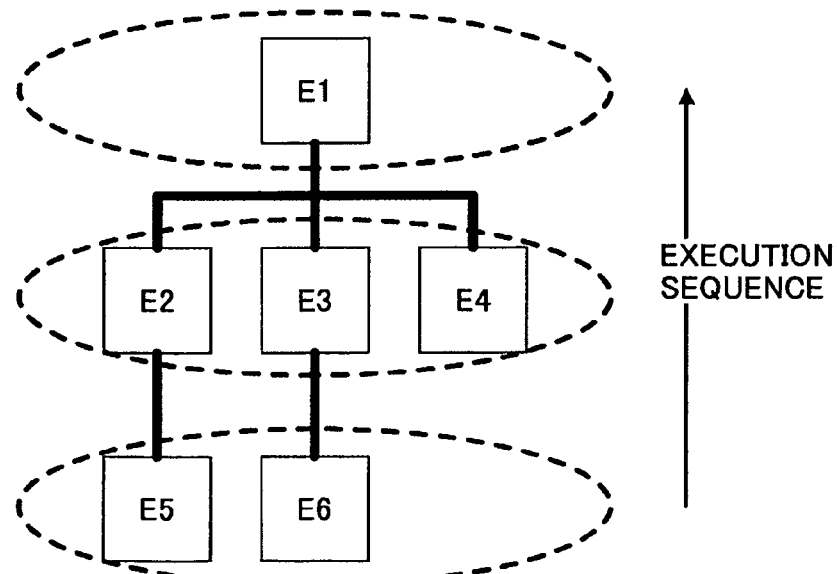
FIG. 42 is a diagram showing an execution sequence for a case where the priority of the execution sequence is from a hierarchical level far away from a highest hierarchical level.

For the sake of convenience, it is assumed that the entities E1 through E6 have a hierarchical structure shown in FIG. 39 which includes three or more hierarchical levels. In the case of the execution sequence determined by (I) the priority according to the width, the step S68 inputs a specified entity number at the bottom (or end) of the execution preparation list shown in FIG. 20, and the execution sequence gives priority to the entities of the same hierarchical level as indicated by broken arrows in FIG. 40. In the case of the execution sequence determined by (II) the priority according to the depth, the step S68 inputs the specified entity number at the top (or beginning) of the execution preparation list shown in FIG. 21, and the execution sequence gives priority to the entities of different hierarchical levels as indicated by broken lines in FIG. 41. In the case of the execution sequence determined by (III) the priority from the hierarchical level far away from the highest hierarchical level (that is, the priority according to the farthest hierarchical level), the step S68 inputs the specified entity number of the hierarchical level far away from the highest hierarchical level to the execution preparation list shown in FIG. 22, and the execution sequence gives priority to the entities of the hierarchical levels far away from the highest hierarchical level as indicated by broken lines in FIG. 42.

Figure 43:
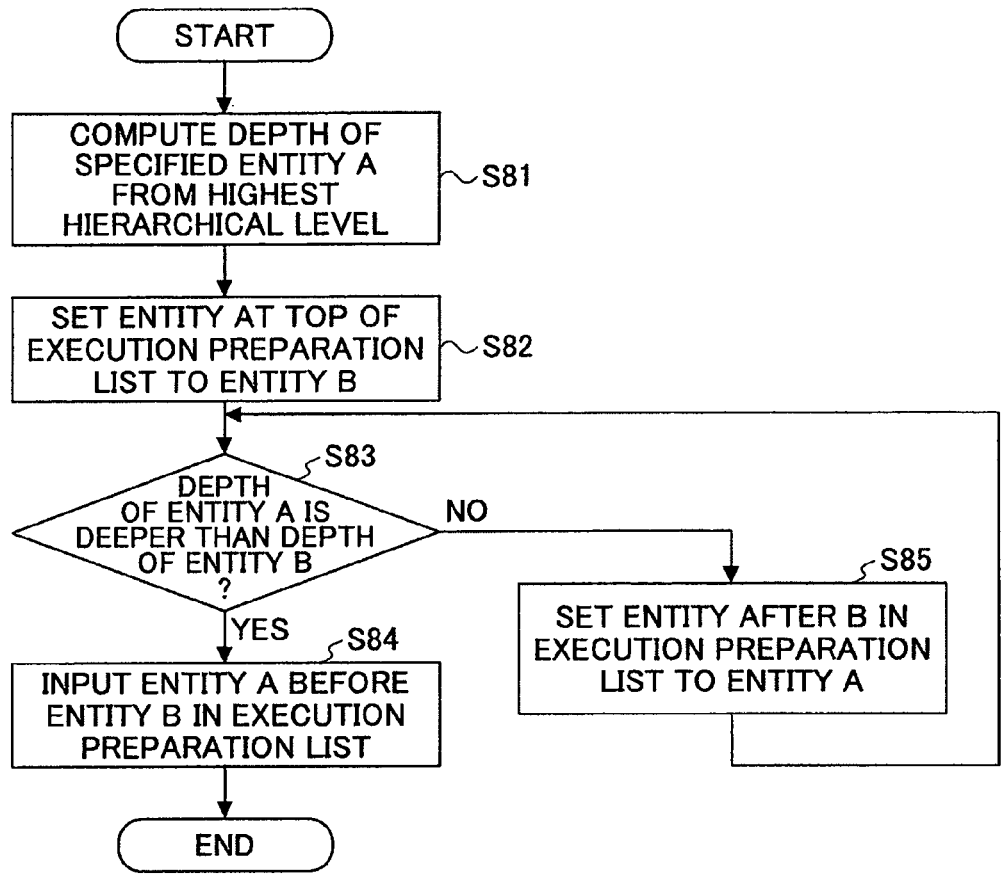
FIG. 43 is a flow chart for explaining the process of the step S68 in more detail.

FIG. 43 is a flow chart for explaining the process of the step S68 in more detail for the case of the execution sequence determined by (III) the priority from the hierarchical level far away from the highest hierarchical level. In FIG. 43, a step S81 computes a depth of a specified entity A from the highest hierarchical level. A step S82 sets an entity B as the entity at the top of the execution preparation list. A step S83 decides whether or not the hierarchical depth of the entity A is deeper than the hierarchical depth of the entity B. The process advances to a step S84 if the decision result in the step S83 is YES, and the process advances to a step S85 if the decision result in the step S83 is NO. The step S85 sets the entity A as the entity after the entity B in the execution preparation list, and the process returns to the step S93. The step S84 inputs the entity A before the entity B in the execution preparation list, and the process ends.

When the processing of the VHDL is executed for each hierarchical level in the order starting from the low hierarchical level, the step S68 can select or switch an option of the execution sequences from (I) the priority according to the width, (II) the priority according to the depth, and (III) the priority from the hierarchical level far away from the highest hierarchical level.

In each of the embodiments and modification described above, it is assumed for the sake of convenience that the VHDL is input. However, a similar processing is possible also when languages other than the VHDL, such as the HDL, is input, in order to obtain similar effects. For example, if Verilog is input as the HDL, a module may be formed by a combination of the entity and architecture. Further, if Electronic Design Interchange Format (EDIF) is input as the HDL, a cell may be formed.

[Hardware Structure]

Figure 44:
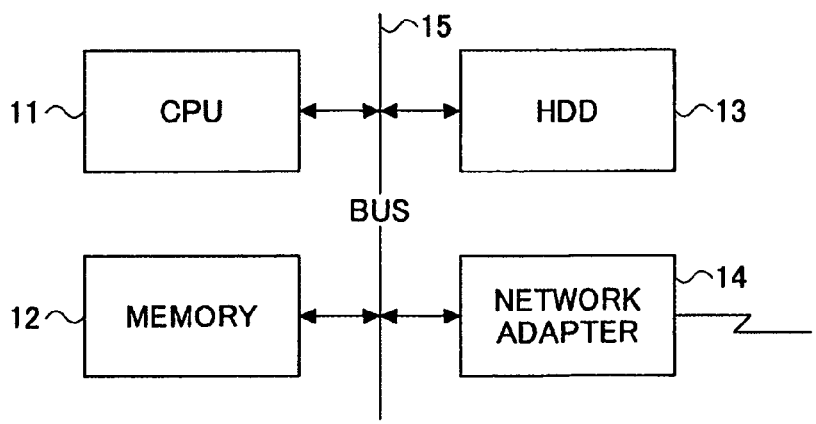
FIG. 44 is a block diagram showing an example of a computer system capable of executing the HDL processing method of the second or fourth embodiment.

FIG. 44 is a block diagram showing an example of a computer system (or computer) having a single processor and capable of executing the HDL processing method of the second or fourth embodiment. As shown in FIG. 44, the computer system has a known structure including a CPU 11 forming a single processor, a memory 12, a Hard Disk Drive (HDD) 13 and a network adapter 14 which are connected via a bus 15. The network adapter 14 functions as an interface which connects the computer system to a network (not shown).

In the computer system shown in FIG. 44 having a single processor, it is possible to execute the processing of the VHDL having a large scale without temporarily using a large amount of computer resources, such as memories, by dividing the processing of the VHDL for each hierarchical level and executing the processing of each hierarchical level one at a time. When executing the processing of the VHDL for each hierarchical level, the processing of the VHDL may be executed for each hierarchical level in the order starting from the low hierarchical level in order to more strictly check the consistency among the hierarchical levels. In this case, it is possible to check the VHDL of the low hierarchical level when executing the processing of the VHDL of the high hierarchical level. In addition, when executing the processing of the VHDL for each hierarchical level in the order starting from the low hierarchical level, it is possible to switch the execution sequence by making it possible to select an option of the execution sequences.

Figure 45:
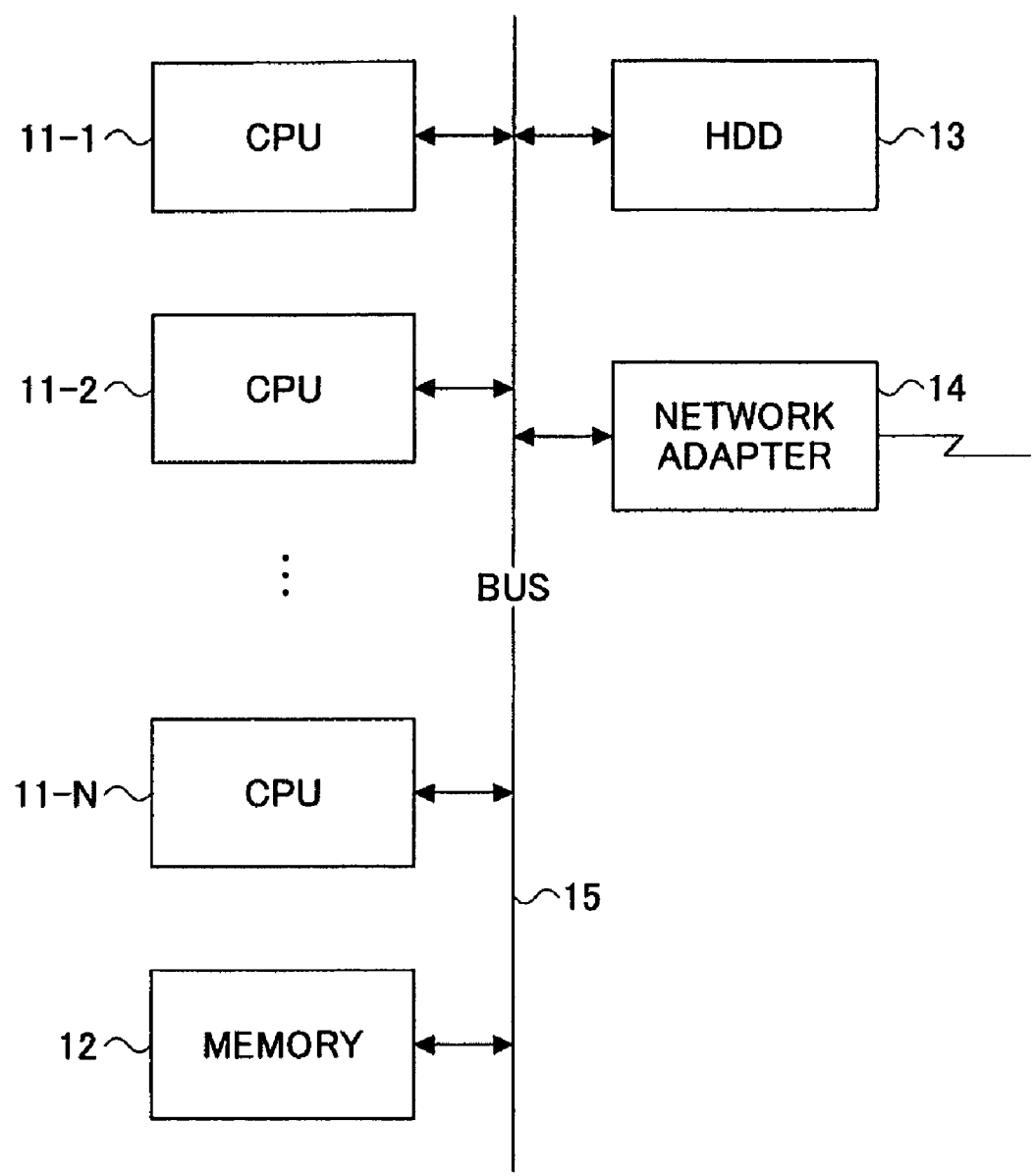
FIG. 45 is a block diagram showing an example of a computer system capable of executing the HDL processing method of the first, third, fifth or sixth embodiment.

FIG. 45 is a block diagram showing an example of a computer system (or computer) having a plurality of processors and capable of executing the HDL processing method of the first, third, fifth or sixth embodiment. As shown in FIG. 45, the computer system has a known structure including a plurality of CPUs 11-1 through 11-N (N is an integer greater than or equal to two) forming the plurality of processors, a memory 12, a Hard Disk Drive (HDD) 13 and a network adapter 14 which are connected via a bus 15. The network adapter 14 functions as an interface which connects the computer system to a network (not shown).

Figure 46:
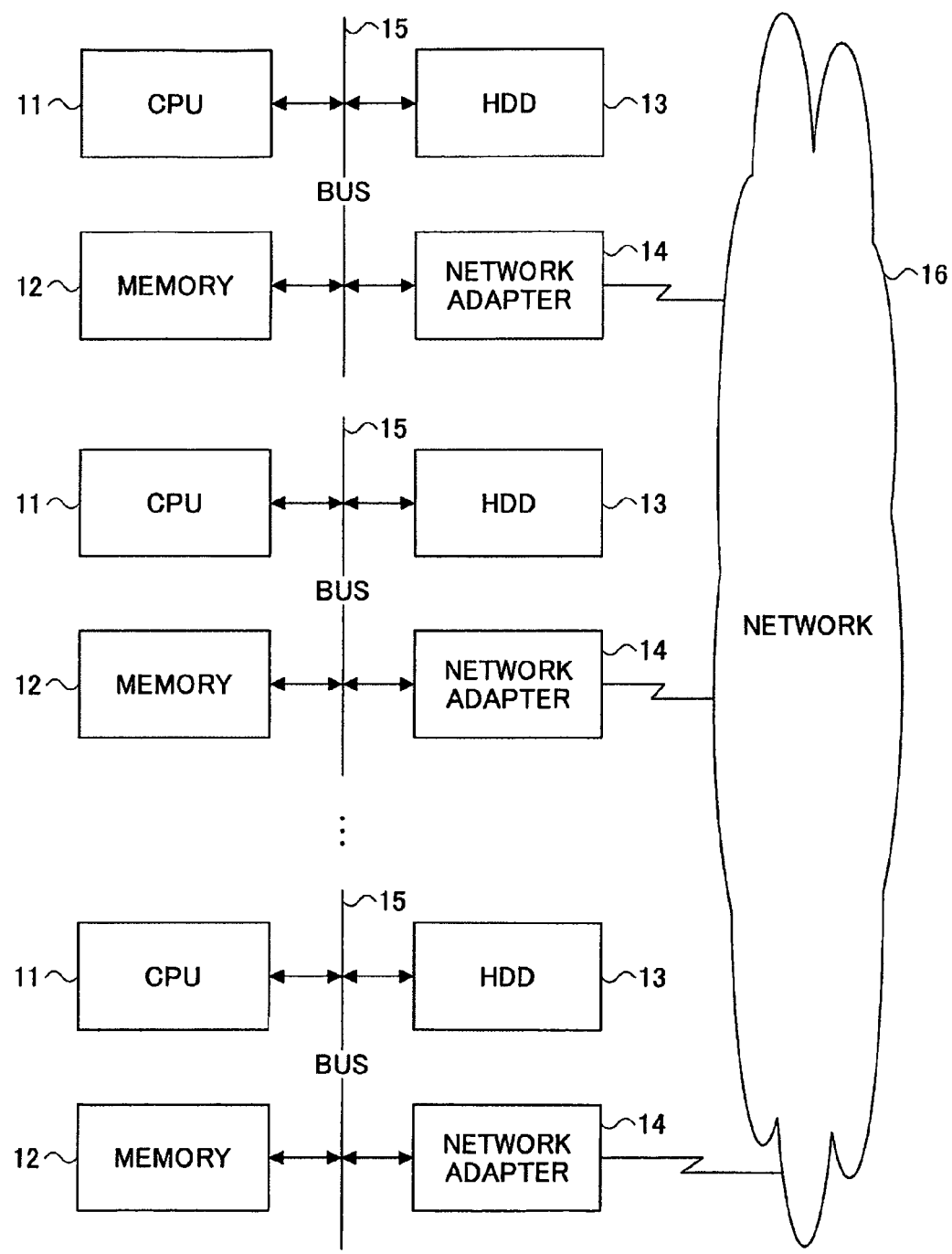
FIG. 46 is a block diagram showing another example of the computer system capable of executing the HDL processing method of the first, third, fifth or sixth embodiment.

FIG. 46 is a block diagram showing another example of the computer system (or computer) having a plurality of computer systems (or computers) capable of executing the HDL processing method of the first, third, fifth or sixth embodiment. In FIG. 46, those parts that are the same as those corresponding parts in FIG. 44 are designated by the same reference numerals, and a description thereof will be omitted. As shown in FIG. 46, N computer systems having the structure shown in FIG. 44 are connected via a network 16. In this case, the CPUs 11 of the N computer systems carry out operations similar to those carried out by the CPUs 11-1 through 11-N shown in FIG. 45.

Of course, the computer systems shown in FIGS. 45 and 46 may execute the HDL processing method of the second or fourth embodiment.

By executing the parallel distributed processing for each hierarchical level in the computer system having the plurality of processors as shown in FIG. 45 or 46, it becomes possible to execute the processing of the VHDL having a large scale in a short time. When executing the processing of the VHDL for each hierarchical level, the processing of the VHDL may be executed for each hierarchical level in the order starting from the low hierarchical level in order to more strictly check the consistency among the hierarchical levels. In this case, it is possible to check the VHDL of the low hierarchical level when executing the processing of the VHDL of the high hierarchical level. In addition, when executing the processing of the VHDL for each hierarchical level in the order starting from the low hierarchical level, it is possible to switch the execution sequence by making it possible to select an option of the execution sequences. Furthermore, when executing the parallel distributed processing for each hierarchical level, it is possible to prevent a large amount of computer resources, such as memories, from being temporarily used by the plurality of processors, by providing a limit to the number of parallel processes.

A program according to one aspect of the present invention causes a computer, such as the CPUs 11 and 11-1 through 11-N, to execute the processing of the HDL by the HDL processing method described above. In addition, a computer-readable storage medium according to one aspect of the present invention is formed by a recording medium which stores such a program in a computer-readable manner. The recording medium is not limited to a particular type of medium. For example, the recording medium may be formed by a magnetic recording medium, an optical recording medium, a magneto-optical recording medium, a semiconductor memory device, and the like. The recording medium may also be formed by the memory 12 or the HDD 13 described above.

Figure 47:
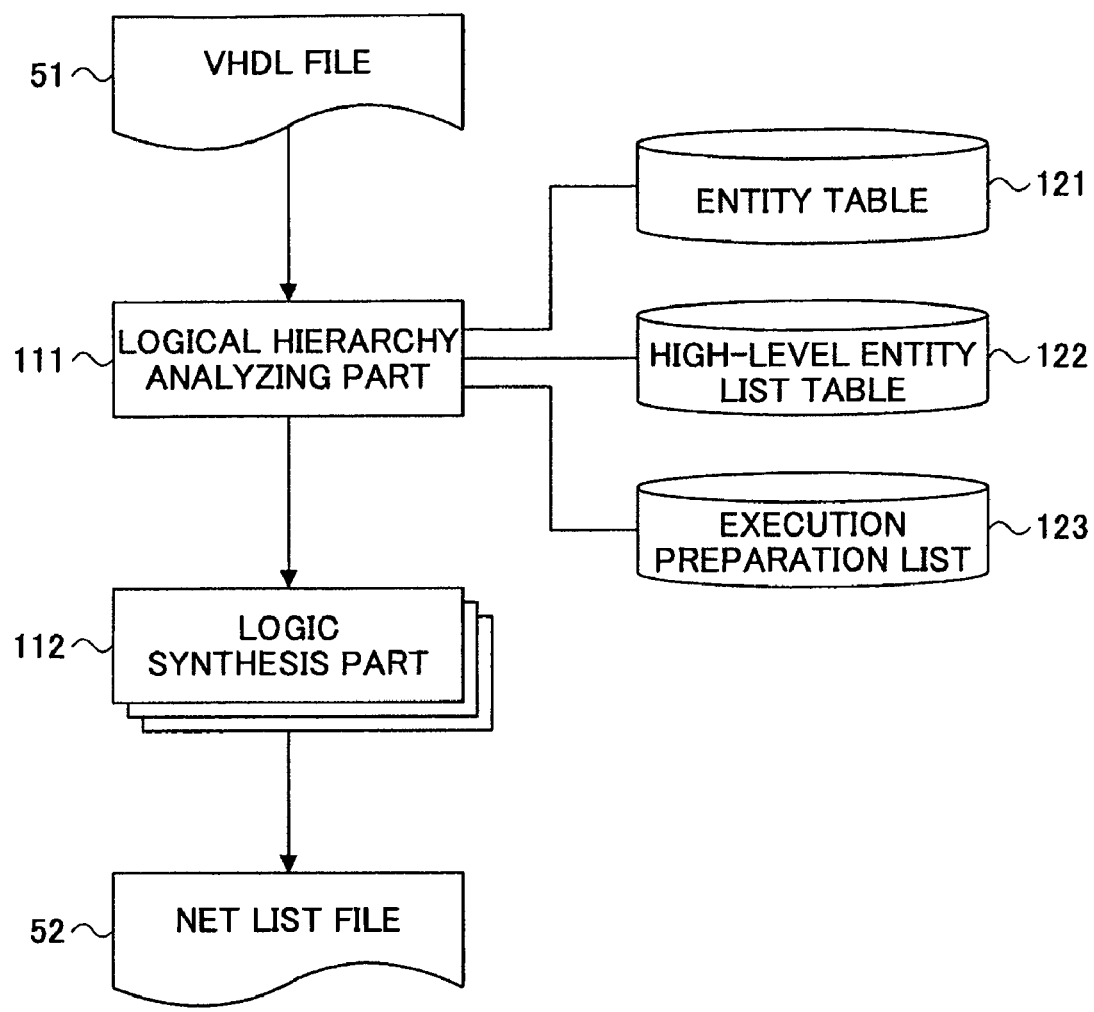
FIG. 47 is a diagram for explaining a logic synthesis.

FIG. 47 is a diagram for explaining a logic synthesis. A VHDL file 51 which is written in VHDL is read into the computer system from a storage unit or a recording medium, such as the HDD 13 or the memory 12, and is input to a logical hierarchy analyzing (or interpreting) part 111. The logical hierarchy analyzing part 111 and a logic synthesis part 112 are formed by the CPU 11 (or the CPUs 11-1 through 11-N) forming the computer system. The logical hierarchy analyzing part 111 analyzes (or interprets) the logical hierarchy of the VHDL file 51, using an entity table 121, a high-level entity list table 122 and an execution preparation list 123. The entity table 121 stores the position information of the VHDL file for each entity, as described above. The high-level entity list table 122 stores a list of links to the entity table 121 indicating a list of the number of the high-level entity list and the number of the entity table 121, as described above. The execution preparation list 123 is input with the entities for which the number of low-level entities is 0, from the entity table 121, as described above. The logic synthesis part 112 performs a logic synthesis based on the logic hierarchy analysis result of the logic hierarchy analyzing part 111, and creates a net list file 52 which is written in a language having a level lower than that of the VHDL. Of course, a compiler part may be provided in place of the logic synthesis part 112, so that compiling of the logic simulation is made based on the logic hierarchy analysis result of the logic hierarchy analyzing part 111.

Therefore, as is evident from the description given heretofore, the present invention is applicable to the processing a HDL file which is written in HDL having a hierarchical structure including three or more hierarchical levels in a Computer-Aided Design (CAD) which supports hardware design.

Further, the present invention is not limited to these embodiments, but various variations and modifications may be made without departing from the scope of the present invention.

What is claimed is:

1. A Hardware Description Language (HDL) processing method, to be implemented in a computer, for processing a HDL file which is written in HDL having a hierarchical structure including three or more hierarchical levels in a Computer-Aided Design (CAD) which supports hardware design, comprising:
analyzing the hierarchical structure of the HDL and obtaining an analysis result; and
processing the HDL one at a time for each hierarchical level based on the analysis result said processing including compiling a logic synthesis or a logic simulation with respect to the HDL, and
wherein said analyzing analyzes the hierarchical structure of the HDL based on an entity table which stores position information of the HDL file for each entity, a high-level entity list table which stores a number allocated to the high-level entity list and a list of links to the entity table indicating a list of numbers allocated to the entity table, and an execution preparation list which is input with entities for which a number of low-level entities is 0 from the entity table.

2. The HDL processing method as claimed in claim 1, wherein said analyzing and said processing are executed by a computer system having a single processor.

3. The HDL processing method as claimed in claim 1, wherein said processing processes the HDL in an order starting from a low hierarchical level of the hierarchical structure.

4. The HDL processing method as claimed in claim 3, wherein said processing determines a process execution sequence according to priority selected from a group consisting of a priority according to a width of hierarchical level, a priority according to a depth of hierarchical level, and a priority from a hierarchical level far away from a highest hierarchical level.

5. A Hardware Description Language (HDL) processing method, to be implemented in a computer, for processing a HDL file which is written in HDL having a hierarchical structure including three or more hierarchical levels in a Computer-Aided Design (CAD) which supports hardware design, comprising:
analyzing the hierarchical structure of the HDL and obtaining an analysis result; and
processing the HDL by a parallel distributed processing for each hierarchical level based on the analysis result, said processing including compiling a logic synthesis or a logic simulation with respect to the HDL, and
wherein said analyzing analyzes the hierarchical structure of the HDL based on an entity table which stores position information of the HDL file for each entity, a high-level entity list table which stores a number allocated to the high-level entity list and a list of links to the entity table indicating a list of numbers allocated to the entity table, and an execution preparation list which is input with entities for which a number of low-level entities is 0 from the entity table.

6. The HDL processing method as claimed in claim 5, wherein said analyzing and said processing are executed by a computer system having a plurality of processors.

7. The HDL processing method as claimed in claim 5, wherein said processing processes the HDL by the parallel distributed processing in an order starting from a low hierarchical level of the hierarchical structure.

8. The HDL processing method as claimed in claim 7, wherein said processing determines a process execution sequence according to priority selected from a group consisting of a priority according to a width of hierarchical level, a priority according to a depth of hierarchical level, and a priority from a hierarchical level far away from a highest hierarchical level.

9. The HDL processing method as claimed in claim 5, wherein said processing processes the HDL by the parallel distributed processing with a limit to a number of parallel process.

10. A non-transitory computer-readable storage medium on which a computer-readable program for causing a computer to process a Hardware Description Language (HDL) file which is written in HDL having a hierarchical structure including three or more hierarchical levels in a Computer-Aided Design (CAD) which supports hardware design, said program comprising:
an analyzing procedure causing the computer to analyze the hierarchical structure of the HDL and obtaining an analysis result; and
a processing procedure causing the computer to process the HDL one at a time for each hierarchical level based on the analysis result, said processing procedure including causing the computer to compile a logic synthesis or a logic simulation with respect to the HDL, and wherein said analyzing procedure causes the computer to analyze the hierarchical structure of the HDL based on an entity table which stores position information of the HDL file for each entity, a high-level entity list table which stores a number allocated to the high-level entity list and a list of links to the entity table indicating a list of numbers allocated to the entity table, and an execution preparation list which is input with entities for which a number of low-level entities is 0 from the entity table.

11. The non-transitory computer-readable storage medium as claimed in claim 10, wherein said analyzing procedure and said processing procedure are executed by a single processor of the computer.

12. The non-transitory computer-readable storage medium as claimed in claim 10, wherein said processing procedure causes the computer to process the HDL in an order starting from a low hierarchical level of the hierarchical structure.

13. The non-transitory computer-readable storage medium as claimed in claim 12, wherein said processing procedure causes the computer to determine a process execution sequence according to priority selected from a group consisting of a priority according to a width of hierarchical level, a priority according to a depth of hierarchical level, and a priority from a hierarchical level far away from a highest hierarchical level.

14. The non-transitory computer-readable storage medium as claimed in claim 10, wherein said processing procedure causes the computer to process the HDL one at a time by a parallel distributed processing for each hierarchical level based on the analysis result.

* * * * *

UNITED STATES PATENT AND TRADEMARK OFFICE
CERTIFICATE OF CORRECTION

| | | |
|---|---|---|
| PATENT NO. | : 8,024,681 B2 | Page 1 of 1 |
| APPLICATION NO. | : 12/314615 | |
| DATED | : September 20, 2011 | |
| INVENTOR(S) | : Furukawa | |

It is certified that error appears in the above-identified patent and that said Letters Patent is hereby corrected as shown below:

Column 15, Line 59, in claim 1, delete "result" and insert -- result, --, therefor.

Signed and Sealed this
Thirty-first Day of January, 2012

David J. Kappos
*Director of the United States Patent and Trademark Office*